United States Patent [19]

Kennedy et al.

[11] Patent Number: 4,644,289
[45] Date of Patent: Feb. 17, 1987

[54] VARIABLE POWER AMPLIFIER FOR AUDIO FREQUENCY SIGNALS AND METHOD

[75] Inventors: Bruce L. Kennedy; Joseph K. Beller; Roger A. Modjeski, all of Santa Barbara, Calif.

[73] Assignee: Carter-Duncan Corporation, Santa Barbara, Calif.

[21] Appl. No.: 677,228

[22] Filed: Dec. 3, 1984

[51] Int. Cl.⁴ .................. H03G 3/22; H03F 3/28; H03F 3/68

[52] U.S. Cl. .................... 330/145; 84/1.11; 84/1.16; 330/66; 330/77; 330/118; 330/120; 330/124 R

[58] Field of Search ............. 330/51, 69, 126, 124 R, 330/149, 66, 118, 120, 123, 122, 77, 145, 255, 295; 84/1.11, 1.16

[56] References Cited

U.S. PATENT DOCUMENTS

| | | | |
|---|---|---|---|
| 2,315,248 | 3/1943 | de Rosa | 381/98 |
| 2,768,249 | 10/1956 | Rockwell | 330/120 |
| 2,794,853 | 6/1957 | Wells et al. | 330/122 X |
| 3,544,694 | 12/1970 | Freeman | 184/1.11 |
| 3,663,735 | 5/1972 | Evans | 84/1.11 |
| 3,973,461 | 8/1976 | Jahns | 84/1.11 X |
| 4,023,078 | 5/1977 | Olliges et al. | 84/1.11 X |
| 4,211,893 | 7/1980 | Smith | 84/1.16 |
| 4,345,502 | 8/1982 | Jahns | 84/1.21 |
| 4,532,476 | 7/1985 | Smith | 330/123 |

OTHER PUBLICATIONS

TUSC Tube Amplifiers sales brochure captioned, "Thanks For the Memory", distributed by TUSC International Sales Office, 3 Oval Drive, Central Islip, New York, 11722.

Primary Examiner—James B. Mullins
Attorney, Agent, or Firm—Daniel J. Meaney, Jr.

[57] ABSTRACT

A variable power amplifier having a constant current differential amplifier driving a cascaded driving amplifier, a variable power amplifier including a vacuum tube for selectively amplifying output signals wherein the drive of the variable power amplifier is determined by the plate shunt resistive loading of the vacuum tube, a push-pull amplifier including an output transformer operatively coupled to the variable power amplifier and to an amplifier output terminal to amplify and apply to the amplifier output terminal a selectively amplified output signal, and a variable damping circuit including a sensing element for sensing the loading on the output tranformer and a circuit for defining a feedback loop for producing a feedback signal having magnitude and polarity which are determined by the sensing element and wherein the variable damping circuit includes a circuit for applying the feedback signal as an input to the constant current differential amplifier to control the current level thereof as a function of the loading on the output transformer as sensed by the sensing element and wherein the plate current resistive loading of the vacuum tube in the variable power amplifier determines the drive thereof to limit the power of the selectively amplified output signals applied to the amplifier output terminal as shown. The combination of a preamplifier having pluggable modules for providing controlled output signals and a variable power amplifier is shown. A method for processing audio frequency electrical signals is also shown.

25 Claims, 23 Drawing Figures

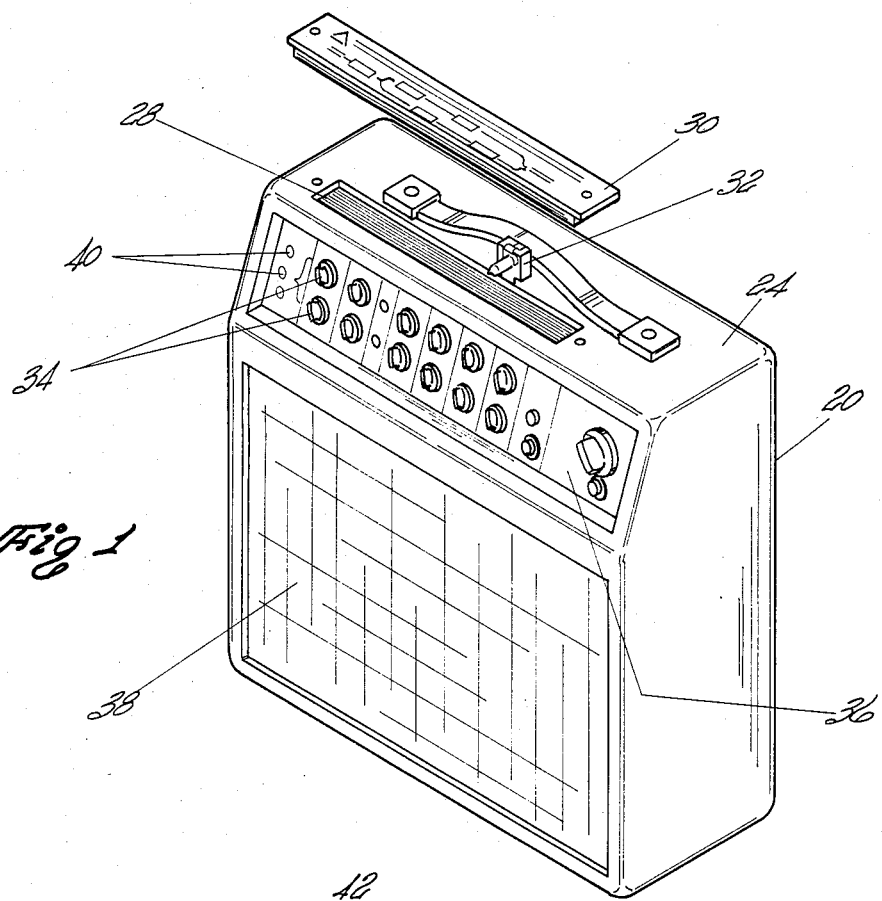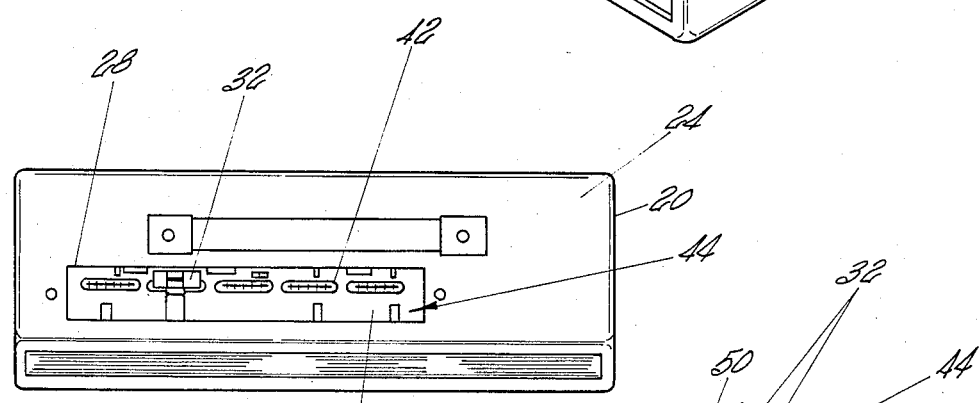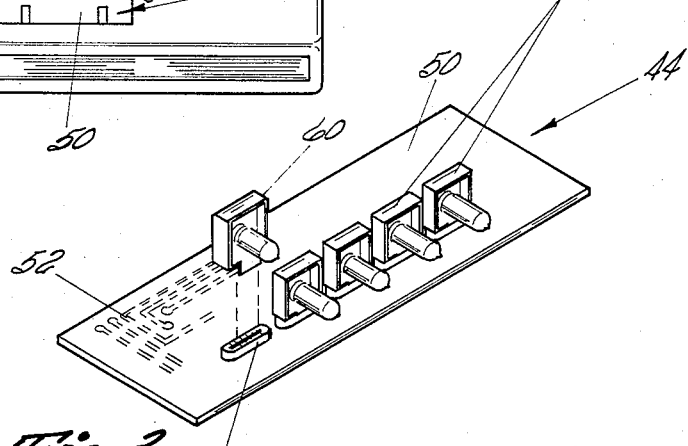

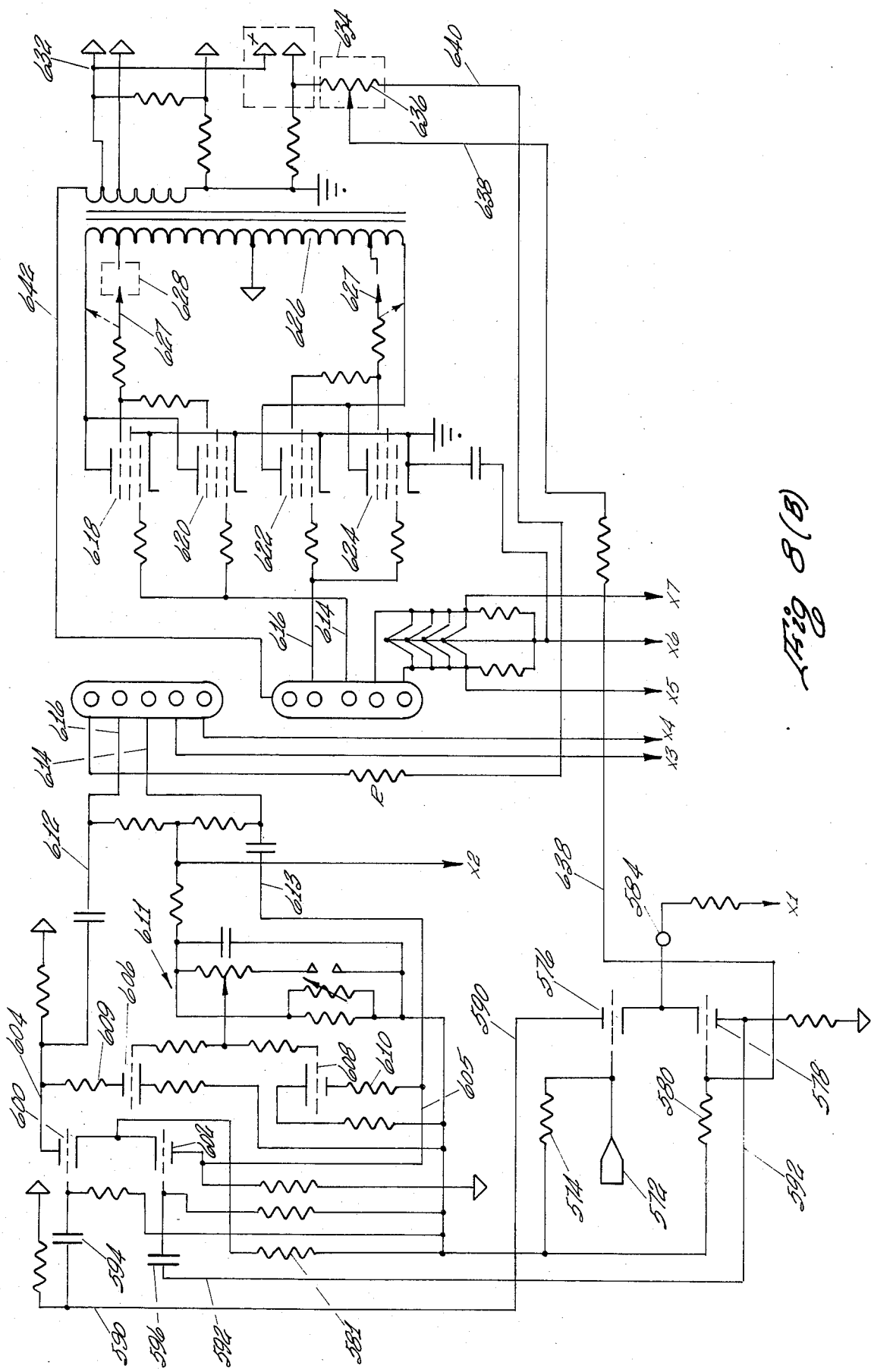

VARIABLE POWER AMPLIFIER FOR AUDIO FREQUENCY SIGNALS AND METHOD

BACKGROUND OF THE INVENTION

1. Field of the Invention

This invention relates to an electronic amplification system for musical instruments and, more particularly, relates to a variable power amplifier adapted for receiving preprocessed audio frequency electrical signals generated by a musical instrument and for providing selectively amplified output signals to an amplifier output terminal for driving an output device, such as a loudspeaker.

2. Description of the Prior Art

It is known in the art to utilize performance amplifiers in connection with musical instruments, such as an electrical guitar, wherein the output thereof has its amplitude, frequency and harmonic distortion modified by the amplifier prior to application of the modified electrical signals to an output device. In the state-of-the-art musical instrument performance amplifiers, the amplifiers traditionally use solid-state devices, such as NPN transistors or PNP transistors, field effect transistors, and the like. One such musical instrument performance amplifier is disclosed in U.S. Pat. No. 4,345,502, which utilizes solid-state devices in the amplifier. In the musical instrument performance amplifier of U.S. Pat. No. 4,345,502, a pair of high-impedance power field effect transistors are connected to an output transformer to provide a relatively low push-pull drain load that effectively presents a high-impedance constant current source to an amplifier. The amplifier, having such high-impedance constant current source output, amplifies and sustains instrument sound, provides large amounts of power to the speaker over a wide range of speaker impedances and enables the production of high-power harmonics through the speaker. In such amplifiers, the use of high-impedance field effect transistors having a very high gain allows, in turn, the use of an output section having no feedback to the output transistors.

Other known musical instrument performance amplifiers utilize vacuum tubes as the active elements. One such tube-type amplifier is offered for sale and sold under the trademark TUSC, and one of the series is identified as the "Prestige Series" programmable tube-type amplifiers. The TUSC tube-type amplifier utilizes a single channel which is adapted to be programmable to have two different operating characteristics such that it simulates a two-channel system. The TUSC tube-type amplifier includes a programmable memory which contains memory means for providing a first preprogrammed set of settings which can utilize the channel as a programmable A channel and wherein the settings on the single amplifier can be changed to a second preprogrammed setting forming a second channel, or program B channel. The programmable memory feature permits programmable overdrive and parametric equalization settings which permit the user to obtain a wider range of tonal possibilities.

U.S. Pat. No. 3,663,735 discloses an arrangement employing two channels and ganged switching devices at the output of each of a pair of channels. One channel includes a means for producing a particular amount of distortion and the other produces a clean, undistorted version of the signal. The switching device in U.S. Pat. No. 3,663,735 employs ganged switching devices at the output of each of a pair of channels under control of a moving foot switch for choosing one channel or the other channel. This arrangement requires relatively complex circuitry and simultaneous control of several switches.

U.S. Pat. No. 3,973,461 discloses a distortion control circuit which includes an input terminal which is fed to a two-terminal system having a distortion channel which includes a distortion circuit and a second channel designated as a clean channel wherein the output of both the distortion channel and the clean channel output signals are concurrently applied across a variable resistor. In this arrangement, the distortion channel provides an output that is in phase with the input thereto, whereby the signals in the two channels will not cancel regardless of the position of the adjustable resistor. In this arrangement, under control of an off-on signal, the distortion channel can be shut off, permittng the signals of the clean channel only to be applied across the variable resistor. When the switch position is changed, the distortion channel is then switched into the circuit and in parallel circuit relationship to the clean channel. This results in an output signal being produced which is a combination of the signals produced by the distortion channel and transmitted by the clean channel across the variable resistor. In the distortion control circuit disclosed in U.S. Pat. No. 3,973,461, either one or both channels are operative to produce either a clean signal or a clean signal having distortion.

U.S. Pat. No. 4,211,893 discloses a dual-mode musical instrument wherein a single-channel amplifying apparatus includes a final output stage which can be switched into the circuit or switched out of the circuit, depending on the type of musical signal desired by the operator. Specifically, the last output stage, which is a triode, is operated such that large amplitude input signals having both positive and negative excursions drive the tube to operate in the nonlinear portions of its characteristics, resulting in an output of distorted signals having both even and odd harmonics. Also, U.S. Pat. No. 4,211,893 discloses that some preceding stages, which are essentially stages of amplification, can either be dual-triode electronic tubes or field effect transistors directly interchangeable with the vacuum tubes. Also, the overdrive saturation principles in the dual-mode musical instrument amplifier can likewise be obtained by any combination of vacuum tubes, field effect transistors or bipolar transistors.

U.S. Pat. No. 2,315,248 discloses an amplification system which is adapted to provide a pseudo-extension of the frequency band of the output signals generated by the amplifier. U.S. Pat. No. 2,315,248 discloses the concept of utilizing two channels, having two amplifiers and two input microphones which are responsive to selected frequency ranges, and the outputs of each of the two channels are then combined by means of a mixing tube which produces an output signal which is a composite of the signals passed by the two separate channels. The amplifier of U.S. Pat. No. 2,315,248 modifies and distorts the tonal quality of audio frequency signals generated by a musical instrument by overdriving the electronic discharge device of one of the stages of the amplifier and providing a nonlinear output.

The operation of triode tubes, pentode tubes, and the like, in amplifiers adapted for Class A, Class AB, Class B and Class C operation are disclosed in a number of references, one of which is the *Radio Amateur's Handbook* by the Headquarters Staff of the American Radio Relay League of Newington, Conn. 06111, U.S.A., as set forth in the 45th Edition dated 1968. The *Radio Amateur's Handbook* includes a detailed discussion of the method for biasing tubes for linear and nonlinear operation, the operation of various types of solid-state devices including field effect transistors and insulated gate field effect transistors. In addition, circuit diagrams, base tube diagrams and a description of miniature receiving tube characteristics are likewise set forth in the *Radio Amateur's Handbook*.

It is also known in the art to utilize a variable current source in the driving section of the amplifier and to limit and/or control drive capability using a resistor bank wherein the absorbed electrical power is a function of the current which limits the output thereof. One known amplifier which uses a variable current source in the driver is a Model D 180 amplifier offered for sale and sold by Mesa Boggie.

Known methods utilized in vacuum tube amplifiers for varying the output power of the amplifier include use of passive elements, such as the amplifier disclosed in U.S. Pat. No. 4,143,235.

U.S. Pat. No. 4,143,245 discloses a device for maintaining a constant distortion output from a musical instrument amplifier over a volume range of the musical system. The amplifier is set at a predesired volume setting and volume control is provided by a potentiometer control interposed between the output of the amplifier which may, for example, be a guitar amplifier, and the loudspeaker. The potentiometer is connected so that one end is in series with the speaker providing the primary means for controlling volume while the other end is in parallel with the speaker. Because the load that the amplifier sees is a function of both the speaker impedance and the potentiometer setting, there is a calibration scale associated with the control dial of the potentiometer so that the amplifier output impedance can be matched to the impedance of the speaker being used.

SUMMARY OF THE PRESENT INVENTION

This invention relates to a variable power amplifier which is adapted to receive and amplify audio frequency electrical signals generated by a musical instrument. In the preferred embodiment, the variable power amplifier includes a constant current differential amplifying means which is adapted to receive preprocessed audio frequency electrical signals and for producing discrete electrical current signals having an out-of-phase relationship therebetween which is representative of the audio frequency electrical signals. A cascaded driving amplifying means receives and amplifies the out-of-phase electrical current signals. A variable power amplifying means which includes a vacuum tube electrically connected to the cascaded driving amplifying means produces and responds to the electrical current signals to provide selectively amplified output signals wherein the drive of the variable power amplifying means is determined by the plate shunt resistive loading of the vacuum tube. A push-pull amplifying means which includes an output transformer is operatively coupled to the variable power amplifying means and to an amplifier output terminal. The push-pull amplifying means amplifies the selectively amplified output signals and applies the same to the amplifier output terminal. A variable damping means, which includes a sensing means, senses the loading on the output transformer and includes means for defining a feedback loop for producing a feedback signal having magnitude and polarity which are determined by the sensing means. The variable damping means includes means for applying the feedback signal as an input to the constant current differential amplifying means to control the current level of the electrical current signals as a function of the loading sensed by the sensing means on the output transformer. The current level of the electrical current signals determines the plate current resistive loading of the vacuum tube in the variable power amplifying means to vary the gain thereof to limit the power of the selectively amplified output signals applied to the amplifier output terminal.

In the musical instrument performance amplifier in U.S. Pat. No. 4,345,502, only a single channel is provided, which channel includes an input section, an amplifying transistor and the field-effect push-pull amplifier which is operatively coupled by a transformer to a loudspeaker. Although the musical instrument performance amplifier of U.S. Pat. No. 4,345,502 includes solid-state devices, there is no suggestion or teaching of a switchable, multichannel preamplifier section to distort the electrical signal or to add preselected harmonic content to the output signal.

The TUSC preprogrammable memory utilizes a single preamplifier channel wherein the elements within the channel are programmed so that the values thereof can be changed, based upon information stored in the memory, by a switching means. The TUSC tube-type amplifier with preprogrammable memory includes means for programmable overdrive and parametric equalization settings to allow for a wider range of total possibilities.

U.S. Pat. No. 3,663,735 utilizes a rockable foot switch to control a complex switching circuit to switch between one element having one circuit which produces a particular amount of distortion from an input signal and a clear channel. The characteristics of each channel are fixed.

The distortion control circuit of U.S. Pat. No. 3,973,461 utilizes two parallel channels which are electrically connected such that either one channel or both channels must be electrically connected into the circuit. The distortion control circuit includes means for turning the distortion on and off, enabling only a single signal processing channel to apply an output signal to the preamplifier output terminal. When both channels are in operation, an output variable resistor receives output signals from each of the channels and produces an output which is a mixture of the two signals.

U.S. Pat. No. 2,315,248 utilizes two parallel electrical signal processing channels, the outputs of which are combined together by a mixing tube to produce an output signal. One of the two signal processing circuits is capable of introducing complex electrical signals wherein the frequency and phase modulation thereof is complex.

U.S. Pat. No. 4,211,893 discloses a single-channel, dual-mode musical instrument amplifier wherein the final output stage can be switched into or out of the circuit to provide output signals which, when the circuit is electrically connected into the preamplifier circuit, results in large amplitude signals which are developed due to operation of the single output stage in the nonlinear portion of its characteristics to produce even and odd harmonics. This is typical of switching a fixed amplification stage into and out of a circuit to control power output.

The above-described patents do not disclose, teach, or suggest the use of a vacuum tube as a shunt device which, cooperating with a cascaded driving amplifying means, functions as a driver for a variable power amplifier. Typically the power output of an amplifier having four tubes connected into two, parallel push-pull stages is reduced by reducing the number of tubes from four to two.

One advantage of the present invention is that the variable power amplifier utilizes a constant current differential stage as a phase inverter wherein the constant current differential amplifier is formed of vacuum tubes and the current control means is a solid-state device, such as an FET current source.

A further advantage of the present invention is that the variable power amplifier utilizes a second driver stage which is formed of a cascaded driving amplifying means comprising a pair of vacuum tubes and wherein a pair of vacuum tubes are utilized as the plate shunt variable power tube to control the output power from the variable power amplifying means.

A yet further advantage of the present invention is that the variable power amplifying means which includes a vacuum tube as a shunt loading device is electrically connected to the cascaded driving amplifying means for amplifying the selectively amplified output signals received from the cascaded driving amplifying means and applying the same as variable power output signals to an amplifier output terminal.

A still further advantage of the variable power amplifier of the present invention is that the push-pull amplifying means which has its power varied by the variable power amplifying means can be operatively coupled through a vacuum tube and a switch arrangement to the output transformer wherein the switch can electrically connect the vacuum tube into the circuit with the push-pull amplifying means to impose selected harmonic signals on the output signal.

Another advantage of the present invention is that the vacuum tube operatively coupled between the push-pull amplifier and an ultralinear transformer can be selected to be a triode vacuum tube which is capable of imposing low-order harmonic signals onto the selectively amplified output signals applied to the amplifier output terminal.

Another advantage of the present invention is that the vacuum tube operatively coupled between the push-pull amplifying means and the ultralinear transformer can be selected to be a pentode which is capable of imosing high-order harmonic signals onto the selectively amplified output signals applied to the amplifier output terminal.

A yet further advantage of the present invention is the preprocessed audio frequency electrical signals applied to the input of the variable power amplifier can be selectively amplified, distorted or have preselected harmonic content added thereto and that the signals can be amplified over a range of gains without electrically affecting the received preprocessed audio frequency electrical signals.

A yet further advantage of the present invention is that the housing for the amplifier includes an upper section having an elongated opening on the top surface thereof such that pluggable modules can be inserted into and removed from a printed circuit board having both a preamplifier and variable power amplifier located within the interior of the housing and wherein each of the pluggable modules is capable of at least one of amplifying, distorting and adding preselected harmonic content to signals processed by the stages into which the pluggable modules are interconnected and the preprocessed audio frequency signals from the preamplifier are applied as input signals to the variable power amplifier.

A yet further advantage of the present invention is that the housing can include a control panel which has externally extending control members which extend from the printed circuit board exterior to the housing such that the user can preset various values on the printed circuit board for each of the independent, separate channels and such that those values will remain at the preestablished settings. The user can then selectively switch between any one of the plurality of output channels with the control member remaining at the preestablished settings such that any one of the pluralities of electrical signal processing channels can be selected and can have its electrical signal characteristics selected by insertion of the pluggable memory modules into the printed circuit board and the selected output from one channel is used as the input to the variable power amplifier.

A yet further advantage of the present invention is that the pluggable module members can be formed of vacuum tubes, solid-state devices, or a combination thereof.

A yet further advantage of the present invention is that the preamplifier printed circuit board can be fabricated to have an input stage which is adapted to receive a pluggable module and two separate, parallel electrical signal processing channels, each of which is electrically connected to the output of the input stage and wherein the switching means operates to electrically connect the output of a selected one of the electrical signal processing channels to the output terminal such that the electrical signals having the predetermined characteristic can be selected by the user as an input to the variable power amplifier.

A yet further advantage of the present invention is that the preprocessed audio frequency signals received and amplified by the variable power amplifier have controlled power input levels.

A yet further advantage of the present invention is that the amplifier control panel can include means for varying the input impedance, which allows use of low and high-impedance active pickups and low-impedance pickups to piezo high-impedance pickups as input to an integrated amplification system having multi-channel signal processing stages within the preamplifier section.

A yet further advantage of the present invention is that the circuit means, which incorporates the first and second electrical signal processing channels and the variable power amplifier section, includes means for controlling the amount of overdrive such that the externally located controls on the control panel can be rotated in a first direction to decrease distortion and in a second direction to increase distortion and a control means for presetting the drive of the variable power amplifier section.

A yet further advantage of the present invention is that the circuit means, which includes the first and second electrical signal processing channels, further includes variable control means which controls the preamplifier output level such that the output level of the electrical signals appearing at the input to the variable power amplifier section of an integrated amplification system can be selectively controlled and will contain the selected signal characteristics independent of the level of volume.

A yet further advantage of the present invention is that the amplifier can include means for indicating which channel in the preamplifier section of the integrated amplification system is in operation. In the preferred embodiment, the amplifier can utilize a colored light system such as red light being channel A and green light being channel B. The switching means can utilize a wide variety of means such as a foot control, remote actuating means, and the like.

A still further advantage of the present invention is that the preamplifier can utilize a plurality of tone controls which are incorporated into and form part of the circuit means to control the bass, midrange and treble frequency range and decibel of the preprocessed audio frequency signals prior to applying the same to the variable power amplifier.

A still further advantage of the present invention is that the preamplifier section of the integrated amplification system can include auxiliary circuits which provide a wide variety of tonals such as reverberation, wah-wah, tremolo, fuzz and distortion.

BRIEF DESCRIPTION OF THE DRAWING

These and other advantages of the present invention will become apparent when considered in light of the detailed description of the preferred embodiment hereinbelow, which includes the following figures:

FIG. 1 is a perspective view of an embodiment of an integrated amplifier system having the preamplifier signal processing means and variable power amplifier with an access thereto located at the top thereof;

FIG. 2 is a top view of the amplifier of FIG. 1 showing a printed circuit board with connectors for receiving the pluggable modules;

FIG. 3 illustrates the preferred embodiment of a primary circuit board for the preamplifier circuit and variable power amplifier and a plurality of pluggable modules formed of circuit means having selected signal processing characteristics;

DESCRIPTION OF THE PREFERRED EMBODIMENT

Figure 4:
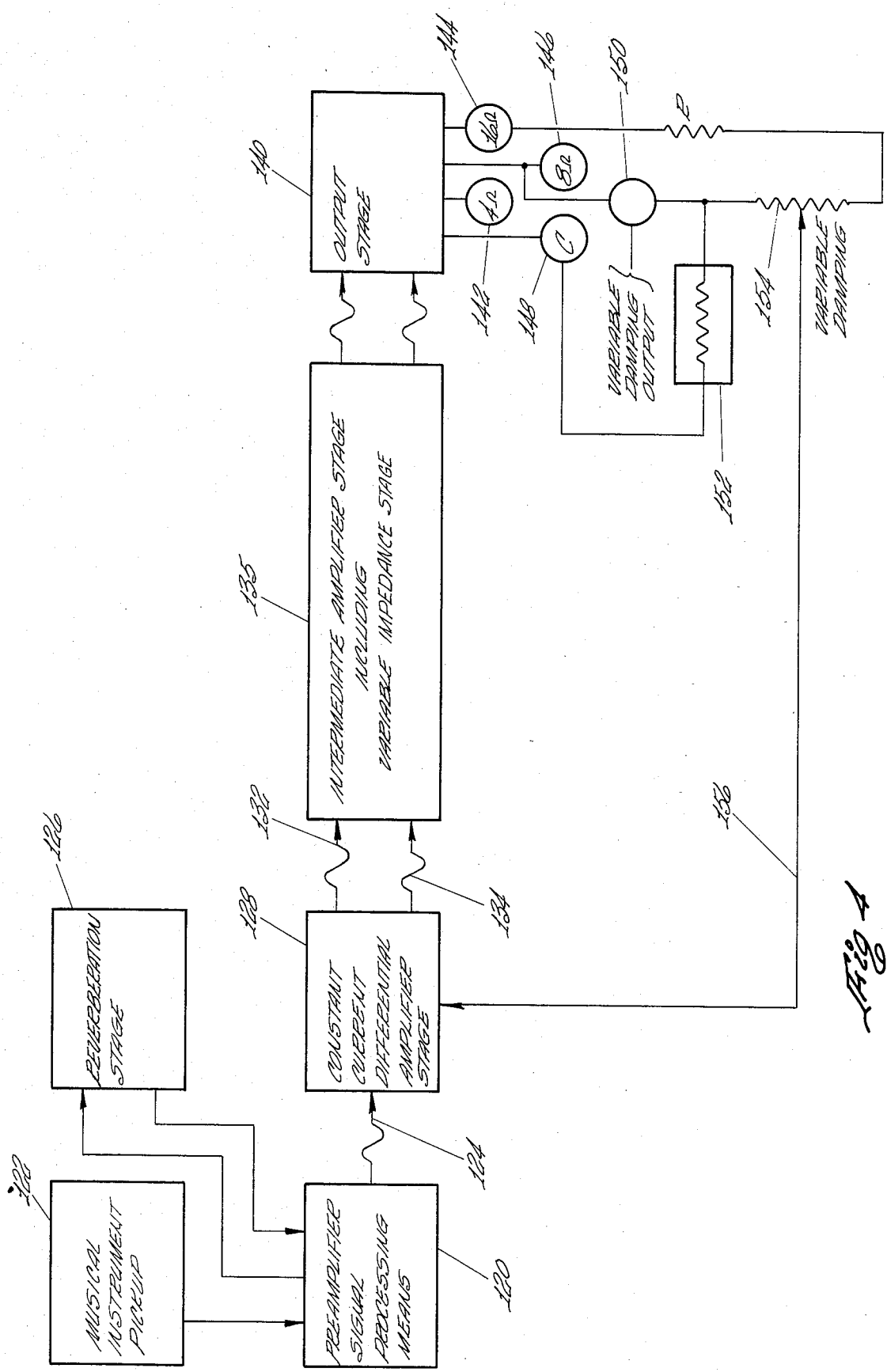
FIG. 4 is a block diagram of an integrated amplification system, including a preamplifier signal processing means and an intermediate amplifier stage having a variable power amplifier means of the present invention.

FIG. 1 illustrates an integrated amplification system which includes a housing 20 for defining a surface 24 which defines an elongated opening 28. A cover member 30 is adapted to be removably attached to the top surface 24 by means of fasteners (not shown). The geometrical dimension of the elongated opening 28 is adapted to receive and pass a pluggable module 32. The preamplifier section included in the housing further includes external circuit adjustment controls, shown generally as 34, which extend from the printed circuit board located interior to the housing 20 and through a plurality of openings in the control panel 36 of the housing 20. The housing further supports input connecting means 40 which are adapted to receive an input jack from an electrical instrument, the signals of which are to be processed. In addition, the housing 20 includes an interior cavity located in the lower portion of the housing for a speaker. The circuit means, which is located in the upper section of the housing 20, includes both the preamplifier circuit and the variable power amplifier for amplifying the processed preamplified signals.

FIG. 2 illustrates the housing 20 and shows the top surface 24 which defines the opening 28. As illustrated in FIG. 2, the opening 28 has sufficient geometrical dimension to receive and pass a pluggable module 32, which is shown to be interconnected into the mother printed circuit board 44. The mother printed circuit board 44 includes a plurality of electrical connectors of which 42 is typical.

FIG. 3 illustrates an electrical circuit means, shown generally as 50, which functions as the mother board 44. The electrical circuit means 50 includes means for defining electrical conductor paths formed into a predetermined pattern of which electrical conductor path 52 is typical. The circuit means includes a preamplifier section having a first electrical signal processing channel which is capable of receiving a selectively amplified audio frequency electrical signal and the variable power amplifier section. The circuit means 50 includes a plurality of connecting means 42 which are located on a printed circuit means 50 and are electrically connected to the electrical conductor paths located on the bottom and illustrated as dashed lines 52. In addition, the circuit means includes means for defining the electrical signal processing channels and other circuitry including the variable power amplifier. The electrical signal processing channels are adaptable to receive pluggable signal processing modules, such as module 32, which are removably inserted into the electrical connectors 42. Module 60 is illustrated in a position where the module is removed from the connector 42.

As illustrated in FIG. 3, at least two pluggable signal processing modules, such as modules 32 and 60, are adapted to be inserted into one of a plurality of connecting means, such as connecting means 42, so as to be electrically connected to the first and second electrical signal processing channels included in the circuit means 50. The pluggable signal processing modules 32 and 60 include electronic means which is capable of at least one of selectively amplifying, distorting and adding preselected harmonic content to the selectively amplified audio frequency electrical signals to produce a processed output signal. In addition, the circuit means includes printed circuit paths, vacuum tubes and solid-state devices, output transformers, and the like.

In use, the variable power amplifier section is adapted to receive from the preamplifier the processed preamplifier signals and is adapted to amplify the signals. As discussed in connection with FIG. 1 above, the variable power amplifier is located in the upper portion of the housing 20 with the preamplifier, control panel and amplifier formed into an integral amplification system.

Referring again to FIGS. 1 and 2, in use the cover 30 is removed from the housing 20 and the pluggable module 32 having the preselected processing characteristics can be removably inserted into the preamplifier through the opening 28. By selecting the electrical characteristics of the pluggable module 32, the characteristics of the signals processed by the processing channel can be selected. The external control means 34 on the amplifier control panel 36 provides means for adjusting the characteristics of the signals, as discussed in connection with FIG. 6.

The block diagram of FIG. 4 illustrates an integrated amplification system comprising a preamplifier signal processing means 120 and a variable power amplifier section having a plurality of stages 128, 135 and 140. The preamplifier signal processing means 120 is adapted to receive audio frequency electrical signals from a musical instrument pickup 122. If desired, the preamplifier signal processing means 120 is adapted to have other circuits electrically connected thereto to produce certain desirable effects, such as reverberation stage 126.

The output of the preamplifier signal processing means 120 is applied to a constant current differential amplifying means, such as a constant current differential amplifier stage 128, which is adapted to receive preprocessed audio frequency electrical signals from the preamplifier signal processing means 120. The output of the preamplifier signal processing means appears as an electrical output signal designated by lead 124. The constant current differential amplifier stage 128 produces discrete electrical current signals having an out-of-phase relationship therebetween which is representative of the audio frequency electrical signals received by the preamplifier signal processing means. The output of the constant current differential amplifier stage 128 is essentially two discrete electrical output signals which are reversed 180 degrees in phase, as represented by leads 132 and 134.

The second or intermediate amplifier stage 135 receives the out-of-phase electrical current signals and comprises a variable power stage which includes a cascaded driving amplifying means to control the drive of the variable power amplifying means. The variable power amplifying means is connected to a cascaded driving amplifying means, in the preferred embodiment, and is responsive to the electric current signals to produce electrically amplified output signals. The drive of the variable power stage is determined by the plate resistive loading of the vacuum tube which forms part of the circuitry. The output of the intermediate amplifier stage 135 having the variable power stage is applied to an output stage 140 which includes a push-pull amplifying means and an output transformer. The push-pull amplifying means is operatively coupled to the variable amplifying means which, in turn, is operatively connected to an amplifier output terminal. The amplifier output terminal includes a plurality of selective resistive loading outputs, such as 4-ohm loading output 142, 16-ohm loading output 144, 8-ohm loading output 146 and a common output 148. One of the outputs, such as 8-ohm output 146, is utilized as an input to a variable damping means, which includes a variable damping output 150. The output appearing on the variable damping output is applied to a sensing means 152 which includes means, including a variable damping resistor 154 and lead 156, for defining a feedback loop for producing a feedback signal having magnitude and plurality which are determined by the sensing means 152 as a function of the load on the output transformer. Variable damping resistor 154 is connected by a resistor R to an output terminal such as terminal 144. The variable damping means applies the feedback signal via lead 156 to control the current level of electrical current signals in the constant current differential amplifier stage 128 as a function of the loading sensed by the sensing means 152 on the output transformer.

Figure 5:
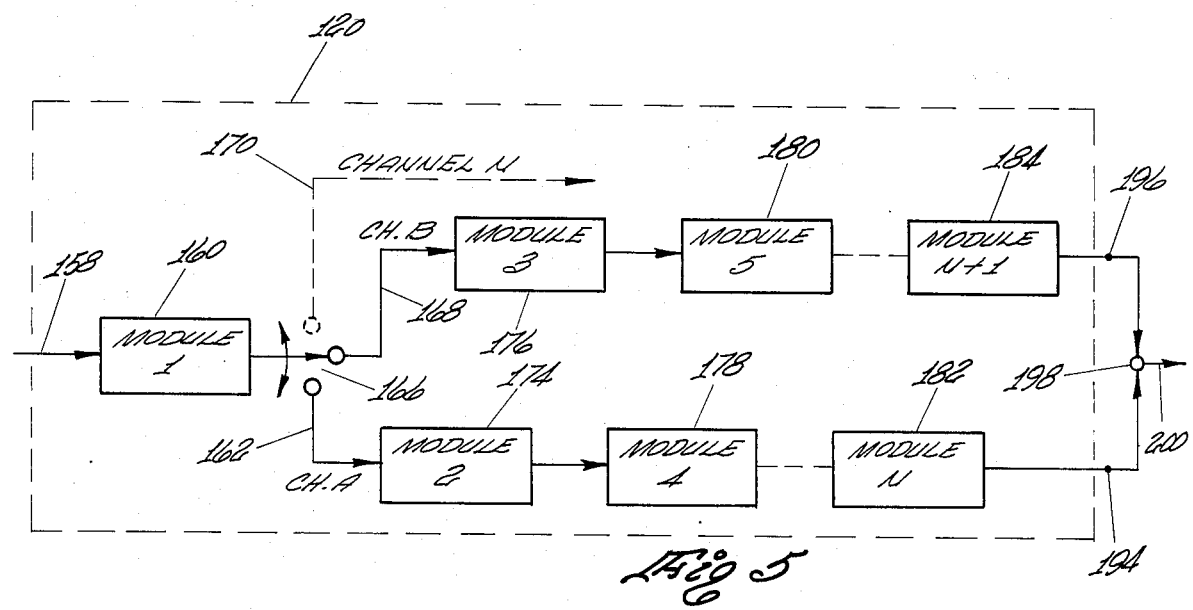
FIG. 5 is a block diagram illustrating the preamplifier section of an integrated amplification system having a plurality of electrical signal processing channels, each of which has a plurality of interconnectable signal processing means and a switching means at the input thereof.

FIG. 5 illustrates the broad concept of the preamplifier signal processing means, which is illustrated by dashed line 120 and which represents the same element 120 illustrated in FIG. 4. In FIG. 5, the preamplifier signal processing means 120 receives audio frequency electrical signals as an input, which signals are represented by arrow 158. The dashed lines represent a housing for the electrical circuits described hereinbelow. The audio frequency electrical signals are generated from a musical instrument, as discussed in connection with FIG. 4. The audio frequency electrical signals are applied to an input stage which is represented by module 1 designated by numeral 160. The output of the input stage 160 is electrically connected to a single-pole, multiple-throw switch 166. In the embodiment illustrated in FIG. 5, the preamplifier signal processing means 120 includes a number of electrical signal processing channels illustrated as channel A, designated by numeral 162; channel B, designated by numeral 168; and channel N, designated by numeral 170. The electrical signal processing channels 162, 168 and 170 are each capable of receiving the selectively processed audio frequency electrical signals from the input stage by means of a frequency electrical signals from the input stage by means of a switching means 166. Each of the electrical signal processing channels 162, 168 and 170 are adapted to produce, in response to the processed audio electrical signals, controlled output signals. Channel N, shown by 170, is intended to illustrate that any number of channels can be utilized, and they are not limited in number. However, the preferred embodiment, as shown in FIG. 6, has two channels and the switching means located at the output thereof.

Referring again to FIG. 5, each channel includes a plurality of selectively interconnectable signal processing means, for example, module 2, identified by numeral 174; module 4, indicated by numeral 178; and module N, illustrated by numeral 182 in the first electrical signal processing channel, or channel A. Similarly, the second electrical signal processing channel 168, which is channel B, includes selectively interconnectable signal processing means, such as module 3, identified by element 176; module 5, identified by element 180; and module N+1, identified by element 184. FIG. 5 illustrates that the output of each of the electrical signal processing channels, output 194 from channel A and output 196 from channel B, are electrically connected to an output terminal 198, the output of which is illustrated by arrow 200. Output 200 is utilized as an input to a subsequent stage of electrical amplification, such as constant current differential stage 128 in FIG. 4.

Each of the selectively interconnectable signal processing means 174, 176, 178, 180, 182 and 184 is capable of at least one of selectively amplifying, distorting and adding preselected harmonic content to the controlled output signals from each of the respective electrical signal processing channels. The switching means 166, in this example, is located at the inputs of the electrical signal processing channel.

Figure 6:
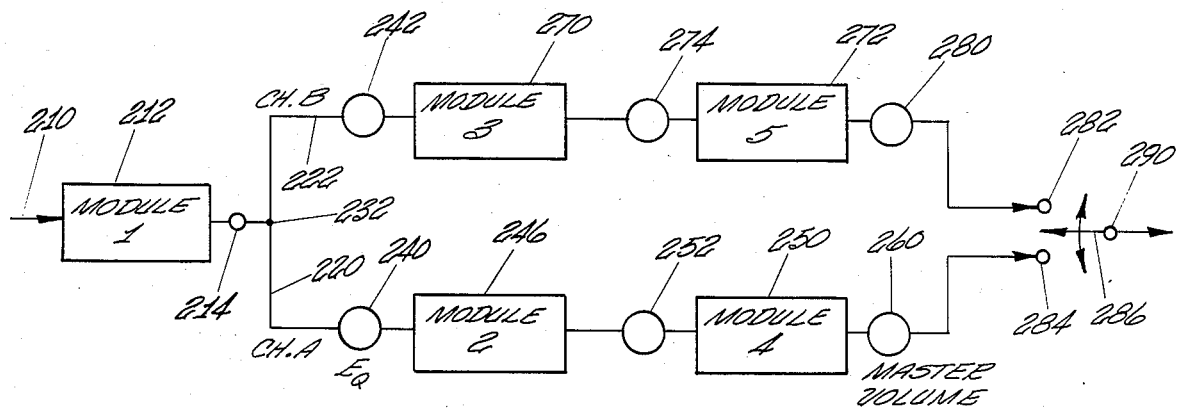
FIG. 6 is a block diagram of the preamplifier section of an integrated amplification system, including an input stage and first and second electrical signal processing stages, which include interconnectable signal processing means and means for adjusting tone levels, overdrive volume of the signals along each channel and a switching means at the output thereof.

FIG. 6 illustrates the preferred embodiment for the preamplifier signal processing means which further includes control means for adjusting the tone, overdrive and volume of the signals within each of the electrical signal processing channels. Specifically, an input signal in the form of an audio frequency electrical signal, illustrated by arrow 210, is applied as an input to the input means, module 212, which is capable of selectively processing, such as selectively amplifying the audio frequency electrical signals generated by a musical instrument, which is illustrated by musical instrument pickup 122 of FIG. 4. In the preferred embodiment, the input means module is selected to amplify the audio frequency electrical signal which produces, as an output signal, a selectively amplified audio frequency electrical signal which appears in output 214. In the embodiment of FIG. 6, the preamplifier includes a first and a second electrical signal processing channel, designated as channel 220 for channel A and 222 for channel B. The output appearing in output 214 from the first module 212 is supplied to a terminal or common point 232. The input of the first electrical processing signal channel 220 is connected to common point 232, and the input of the second electrical signal processing channel 222 is likewise connected to common point 232.

The first electrical signal processing channel 220 includes a tone control, illustrated by element 240, while the second electrical signal processing channel 222 includes a tone control 242. A typical tone control circuit is illustrated herein as FIG. 14. Each of the electrical signal processing channels 220 and 222 are capable of receiving from the input processing module 212 processed audio frequency electrical signals which are adapted to be further processed by each of the first and second electrical signal processing channels 220 and 222. The first electrical signal processing channel 220 includes, in addition to tone control 240, a pair of selectively interconnectable signal processing means 246 and 250. An overdrive control means 252 is provided as a means for selectively applying a portion of the output signal received from module 246 to the module 250. The output of module 250 is controlled by a master volume control means 260 to control the magnitude of the output signal ultimately applied to terminal 284 of a single-pole, double-throw switch 286. The switch 286 applies the output signal to an output terminal 290. The second electrical signal processing channel 222 likewise includes, in addition to the tone control 242, a module 270 and a module 272, an overdrive control means 274 and a master volume control means 280. The output of the master volume control means 280 is applied to terminal 282 of the single-pole, double-throw switch 286. The controlled output signal which appears at output terminal 290 is applied to the input of an amplification stage.

Module 212 of the input stage, modules 246 and 250 of the first electrical signal processing channel 220 and modules 270 and 272 of the second electrical signal processing channel 222 contain interchangeable signal processing means in the form of electrical circuits which are capable of at least one of selectively amplifying, distorting or adding preselected harmonic content to the electrical signals being processed by each of the various stages. The interchangeable signal processing means produce the controlled output signals having characteristics determined by the specific circuitry utilized in each of the modules.

Figure 7:
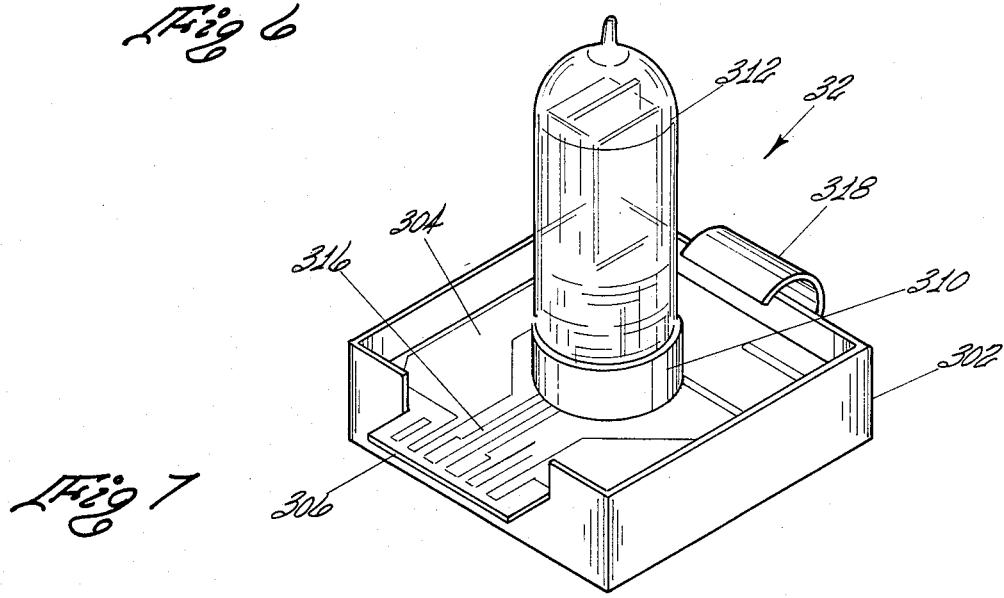
FIG. 7 is a perspective top view of one example of a pluggable module circuit having a single vacuum tube.

FIG. 7 is a perspective view of a pluggable module which can be utilized for the selectively interconnectable processing means described in connection with FIGS. 5 and 6 and specifically for the circuitry illustrated in FIGS. 9 through 13. The pluggable module, shown generally as 32, includes a generally rectangular-shaped support 302 which has mounted therein a small printed circuit board 304 which has extending therefrom an elongated electrical connecting means 306. In the embodiment illustrated in FIG. 7, the printed circuit board 304 includes a tube socket support 310 which is adapted to support a vacuum tube, shown as 312. Other discrete components which are required for the circuit are mounted on the printed circuit board 304. The printed circuit board 304 likewise includes printed circuit means, shown generally as 316, which is formed into a predetermined pattern and electrically connects all the components and active elements together to form a circuit, such as the circuit illustrated in FIG. 10. A handle 318 facilitates insertion and removal of the pluggable module from the mother printed circuit board.

Figure 8A:
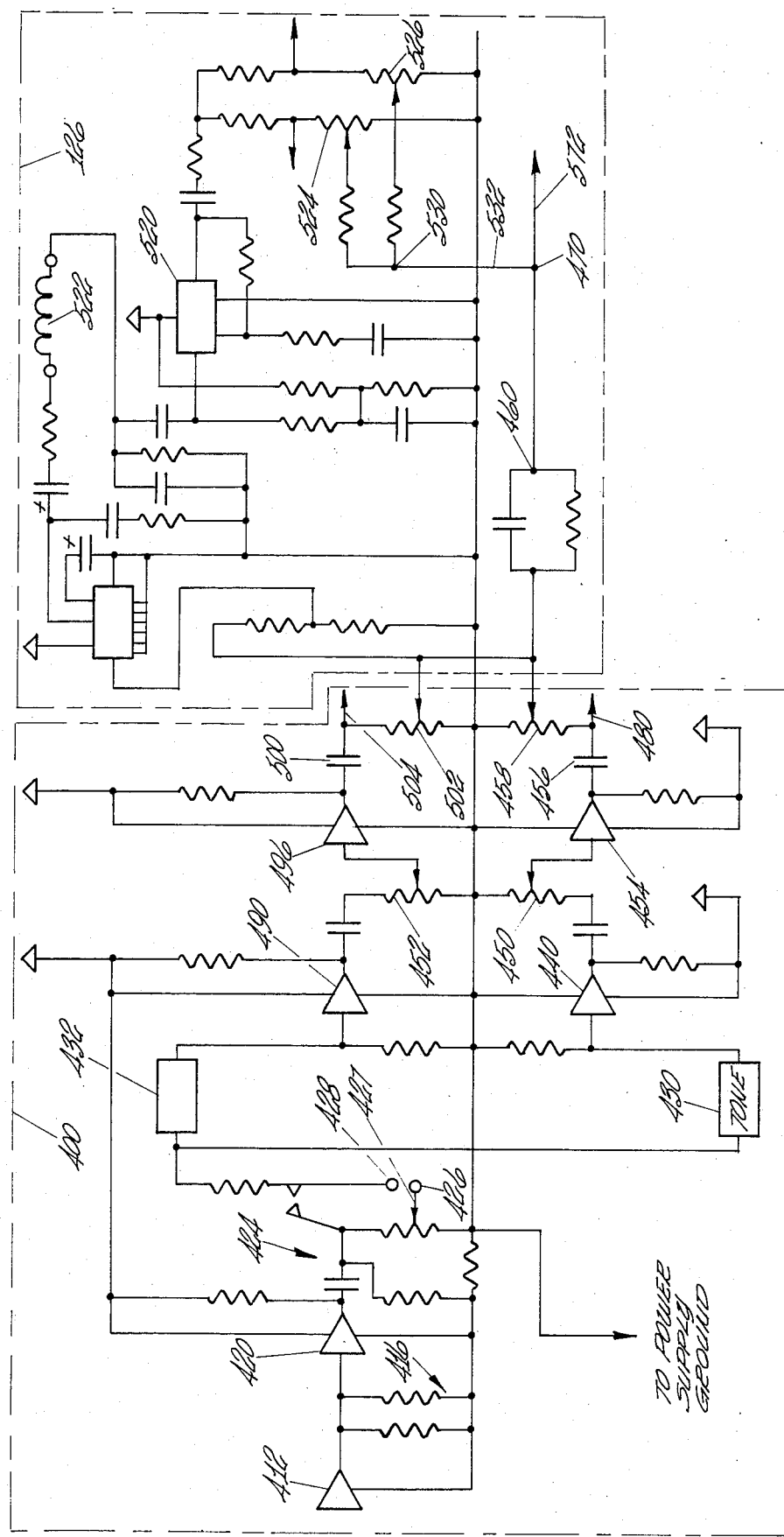
FIGS. 8(A), 8(B) and 8(C) comprise an electrical schematic diagram of the preamplifier section and variable power amplifier section of an integrated amplification system showing circuit means thereof.
Figure 8:
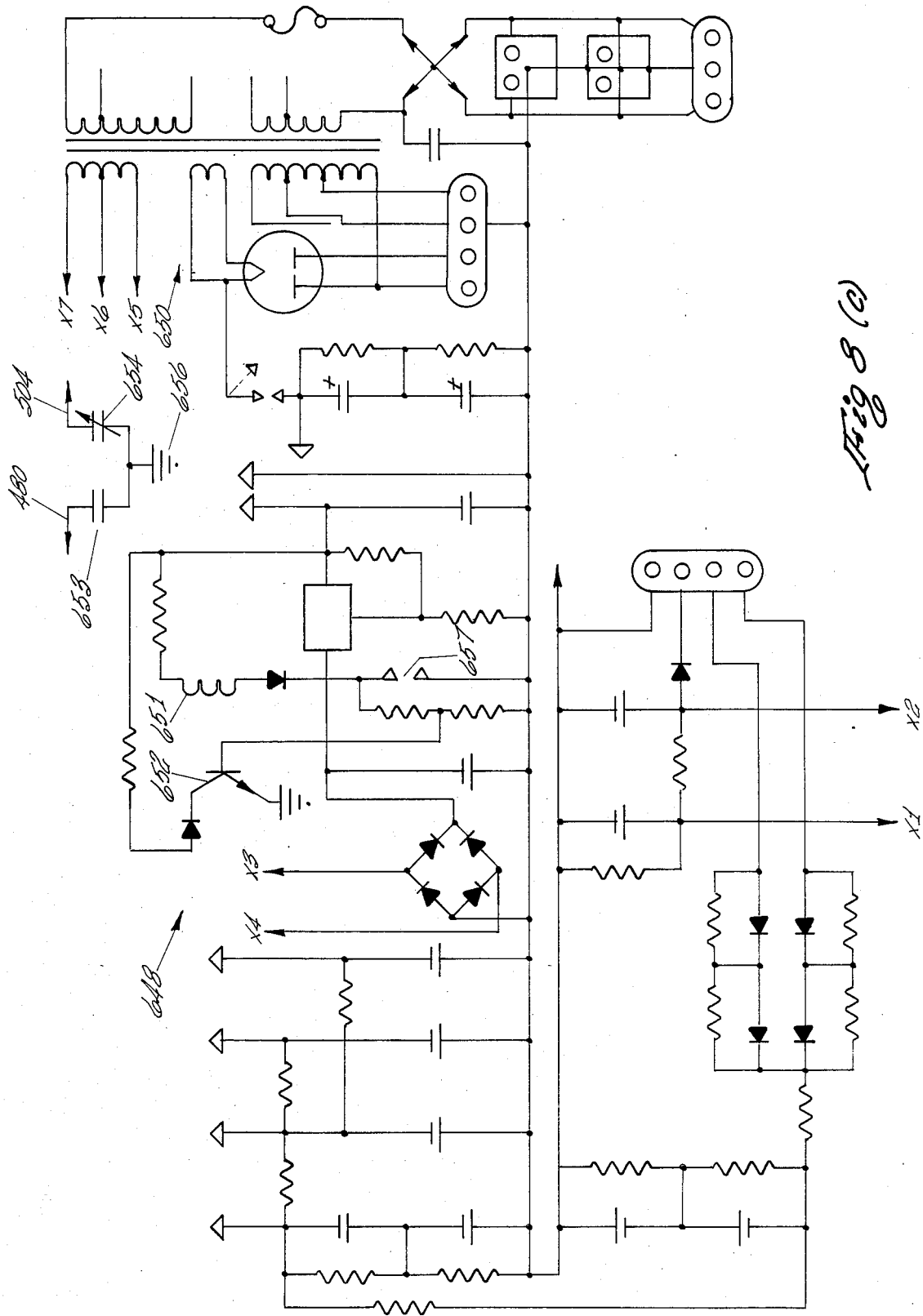

In the preferred embodiment, the pluggable module illustrated in FIG. 7 is adapted to be plugged into a printed circuit board having the circuit means described in FIG. 8. The printed circuit board includes connecting means which forms part of the input means or part of the selectively interconnectable signal processing circuits, as described herein, to permit the pluggable module to be selectively inserted into and removed from the printed circuit board. In concept, any one of the circuits described herein in FIGS. 9 through 13 can be fabricated into a pluggable module in the design configuration of FIG. 7. Of course, not all of the circuit diagrams that are possible are illustrated in FIGS. 9 through 13, and it is understood that those illustrated herein are merely exemplary in nature and that any type of electrical circuit which utilizes vacuum tubes, solid-state components or any combination thereof can function as a selectively interchangeable signal processing means which can be utilized in the circuits as described herein.

FIG. 8(A) is a schematic diagram of the preferred embodiment of a preamplifier having stages corresponding to the block diagram of FIG. 6. However, the interchangeable signal processing means are shown generally in FIG. 8(A). FIGS. 9 through 13, described hereinafter, are circuits for the interchangeable signal processing means of the preferred embodiment which can be utilized in the schematic diagram of FIG. 8(A).

In the schematic diagram of FIG. 8(A), which illustrates the electrical wiring for the preamplifier illustrated by the block diagram in FIG. 6, the portion of the electrical circuit diagram enclosed by dashed box 400 corresponds to the circuit of FIG. 6. The portion of the circuit which is enclosed by the other dashed box 26 represents a reverberation control circuit which is electrically connected to the preamplifier of the present invention.

The preamplifier shown by dashed line 400 is adapted to receive audio frequency electrical signals generated by a musical instrument which is applied at input 412. The electrical signals are applied across a resistance network 416 as an input to an input means 420. The output of the input means 420 is applied to a special effects loops, illustrated generally as 424. The special effects loop 424 allows adjustment of the signal level being applied to the effects loop to optimize the signal-to-noise ratio of the signal. The input stage, including input means 420, effectively acts as a buffer for the electrical pickup operatively connected to the input 412 which functions to isolate the effects loop from the electromagnetic pickup. This results in reduced noise and a clean signal after the first input means 420. The special effects loop 424 has an "Effects Send" position, illustrated by pole position 426. When the switch is in the "Effects Send" position, illustrated by pole member 427 contacting position 426, the output of the input means 420 is applied to the input of the effects loop. When the pole member 227 contacts position 428, which is the "Effects Return" position, the input is derived from the output of the effects loop. The output of the effects loop 424 is applied to the first and second electrical signal processing channels.

In FIG. 8(A), the first channel includes a tone control 430, and the second electrical signal processing channel includes a tone control 432. The output from tone control 430, which is electrically located in the first electrical signal processing channel, is applied to a first selectively interchangeable signal processing means 440 which is capable of at least one of selectively amplifying, distorting and adding preselected harmonic content to the first controlled output signal. The output of the first selectively interconnectable signal processing means 440 is applied through a variable potentiometer 450, which acts as an overdrive or means for controlling the magnitude of the signal from the first selectively interconnectable signal processing means 440 to a second selectively interconnectable signal processing means 454. Thus, the signal from variable potentiometer 450 functions as an input to the second selectively interconnectable signal processing means 454 of the first electrical signal processing channel. The output of the second selectively interconnectable signal processing means 454 is applied via a coupling capacitor 456 and a master output control potentiometer 458 and an RC coupling circuit 460 to an output terminal 470. In addition, the coupling capacitor 456 likewise applies the output signal from the second selectively interconnectable signal processing means 454 to a lead 480 which is electrically connected to a contact of a relay. If the coil of the relay is actuated, the relay contact electrically connects lead 480 to ground, which effectively shorts out the first electrical signal processing channel and prevents the aplication of any electrical signals thereacross to the RC coupling network 460 and subsequently to the output terminal 470.

In a similar manner, the second electrical signal processing channel, which includes tone control 432, includes a third selectively interconnectable signal processing means 490, and an overdrive control potentiometer 452 which applies its output in a similar manner as described hereinbefore for the first electrical signal processing means to the fourth selectively interconnectable signal processing means 496. The output of processing means 496 is applied by a coupling capacitor 500 to a master potentiometer 502 and to lead 504, which is electrically connected to a normally closed contact of a relay. In a similar manner, if the relay coil is not actuated, the relay contact electrically connects lead 504 to ground, thereby shorting out and preventing the output from the fourth selectively interconnectable signal processing means 496 from being applied to the master control potentiometer 502. The output of master control potentiometer 502 is likewise applied through the RC coupling network 460 to the output terminal 470.

In the circuit diagram of FIG. 8(A), the input means 420 and the first, second, third and fourth selectively interconnectable signal processing means 440, 454, 490 and 496, respectively, are electrical circuits at least one of which is capable of at least one of selectively amplifying, distorting and adding preselected harmonic content to the first controlled output signal or the second controlled output signal by the RC coupling network 460 to the output terminal 470.

In the circuit diagram of FIG. 8(A), the reverberation circuit shown by dashed line 126 (which corresponds to the reverberation control 126 of FIG. 4) can be selectively switched into or out of the circuit to provide for the reverberation effect. The circuitry illustrated in FIG. 8(A) within dashed box 126 is known in the art and includes an integrated circuit 520, which may be an integrated circuit element such as NE-5534 integrated circuit. A reverberation coil 522 for storing the electrical signals to provide the reverberation effect wherein the magnitude of the reverberation for each channel is controlled by potentiometers 524 and 526, the outputs of which are electrically connected to a common point 530 which is, in turn, electrically connected by lead 532 to the common output terminal 470. Thus, the common output terminal 470 functions as a summing point for the outputs of each of the electrical signal processing channels and output from the reverberation circuitry 126. The output from the preamplifier appears as output 572.

FIG. 8(B) illustrates the variable power amplifier section of the integrated amplifying means, and the output 572 from the preamplifier of FIG. 8(B) is the input to the variable power amplifier section. The variable power amplifier has a constant current differential amplifying means which comprises a pair of triode vacuum tubes 576 and 578. The constant current differential amplifying means is adapted to receive the preprocessed audio frequency electrical signals on input 572. Input 572 applies the preprocessed audio frequency electrical signals as an input to a constant current differential amplifying means and, in the preferred embodiment, as an input to triode vacuum tube 576. The preprocessed audio frequency electrical signals on input 574 are specifically applied to the grid of vacuum tube 576. The constant current differential amplifying means, including the vacuum tubes 576 and 578, produces discrete electrical current signals having an out-of-phase relationship therebetween which is representative of the audio frequency electrical signals. The pair of triode vacuum tubes 576 and 578 are electrically connected in a common cathode configuration wherein the anode/cathode current level is controlled by a field effect current source 584. In the preferred embodiment, the FET current source is approximately 2 milliamps. The current source differential amplifier is electrically connected in a push-pull configuration with a phase reversal between the two stages. The grid of the other triode 578 has its operating voltage established by feedback signals from a feedback loop including lead 638. The grid of vacuum tube 578 is coupled through resistors 580 and 581 to the grids of vacuum triodes used in the next stage, as will be explained hereinafter. The discrete electrical current signals appear on outputs 590 and 592 and are AC coupled through capacitors 594 and 596, respectively, to the next stage, which comprises a cascaded driving amplifying means which, in the preferred embodiment, comprises a pair of vacuum triodes 600 and 602. The vacuum triodes 600 and 602 are electrically connected in a common cathode configuration, and the cathodes are operatively coupled through resistors 580 and 581 to the grid of the vacuum tube 578 of the constant current differential amplifying means. The cascaded driving amplifying means receives and amplifies the out-of-phase electrical current signals, and the output thereof appears across outputs 604 and 605. Outputs 604 and 605 apply the amplified, out-of-phase electrical current signals to a variable power amplifying means which includes cascaded driving amplifying means including triodes 600 and 602 a pair of vacuum tubes 606 and 608 which function as a variable impedance shunt within the variable power amplifying means to limit the voltage drive to the output stage. The variable power amplifying means, including vacuum tubes 606 and 608, produces, in response to the electrical current signals received from the cascaded driving amplifying means, selectively amplified output signals which appear on outputs 612 and 613. The plate shunt resistive loading is established by resistors 609 and 610, and the grid operating voltages are established by the resistive network shown generally as 611 with lead $x_2$ thereof being the negative grid bias from the power supply identified as lead $x_2$ in FIG. 8(C). The variable power amplifying means includes the triode vacuum tubes 606 and 608 having the selected plate resistors 609 and 610 electrically connected thereto. The anode/cathode current of vacuum tubes 606 and 608 is controlled by the magnitude of the current passing through each triode vacuum tube plate resistor 609 and 610. The output of the variable power amplifying means appears on outputs 612 and 613, and such outputs are applied as inputs to a push-pull amplifying means by leads 614 and 616. In the preferred embodiment, the push-pull amplifying means includes four pentodes 618, 620, 622 and 624. The amplified discrete electrical signals appearing on lead 614 are applied to pentodes 618 and 620, and the signals appearing on input 616 are applied to pentodes 622 and 624. The push-pull amplifying means is operatively coupled to an output transformer 626. In the preferred embodiment, transformer 626 can be typically any audio output transformer which is operatively coupled through a transformer switching means 627 wherein the transformer switching means is adapted to connect a vacuum tube or other harmonic signal generating means, illustrated by dashed block 628, electrically in series between the pentodes 618, 620, 622 and 624, which provide the push-pull amplifying of the discrete electrical signals, and the transformer 626. The switching means 627 is capable of bypassing the harmonic signal generating means illustrated by dashed box 628 and connecting the push-pull amplifier pentodes 618, 620, 622 and 624 directly to the taps on the windings of output transformer 626 as illustrated in FIG. 8(B). If a vacuum tube is used in the circuit 628, circuit 628 may be a triode vacuum tube which is capable of imposing a low-order harmonic signal onto the selectively amplified output signals applied to the amplifier terminal. In the alternative, the circuit 628 may be a pentode vacuum tube which is capable of imposing higher-order harmonic signals onto the selectively amplified output signals applied to the amplifier output terminal. One transformer which can be used as an audio output transformer would be an ultralinear wound transformer.

The output of the transformer 626 is applied to a plurality of output terminals, illustrated generally as 632, having the ohm values as described in connection with output stage 140 in FIG. 4.

A variable damping means includes sensing means 634 having a variable resistance 636 which establishes a feedback signal on lead 638. The magnitude and polarity of the feedback signals produced on lead 638 are based upon and are a function of the output loading sensed by sensing means 634 on the output terminals, which is representative of the loading on the output transformer 626. The variable damping means includes means, such as lead 638, for applying the feedback signals as an input to the constant current differential amplifying means and specifically applies the feedback signal to the grid of the second vacuum tube 578. Thus, the cascaded driving amplifying means is responsive to the magnitude and phase of the feedback signals appearing on lead 638, which signals are a function of the loading on the output transformer 626. The feedback signal controls the current level within the constant current differential amplifying means. Thus, the level of the discrete electrical current signals produced by the constant current differential amplifying means is a function of the loading sensed by the sensing means 634 on the output transformer 626. The current level of the electrical current signals determines the plate current resistive loading of the vacuum tubes 606 and 608 in the variable power amplifying means to vary the gain thereof to limit the power of the selectively amplified output signals applied to the output terminal by the push-pull amplifying means.

FIG. 8(C) discloses the schematic diagram for the power supply and relay switching means. As illustrated in FIG. 8(C), there are two separate power supplies: (i) a power supply shown generally as 648 for the power supply to the preamplifier and relay switching circuit, and (ii) a second power supply 650 which comprises a tube rectifier for the variable power amplifier. In addition, the power supply 648 applies an energizing voltage to relay coil 651 and to a switching means in the form of an NPN transistor 652. The relay includes normally open relay contact 653 and normally closed contact 654. Both contracts 653 and 654 are electrically connected to a ground 656. Lead 480, which is electrically connected to normally open contact 653, receives the output signals from the module 454 of the first electrical signal channel processing means and isolates the signals from ground 656 because contact 653 is a normally open contact. Lead 504, which is electrically connected to normally closed contact 654, receives the output signals of the module 496 from the second electrical signal processing channel and normally applies the output signals to ground 656 because contact 654 is a normally closed contact. Thus, depending on whether relay coil 651 is energized or deenergized, one of the first electrical signal processing channel output appearing on lead 480 or the second electrical signal processing channel output appearing on lead 504 is applied to ground. The output of one of the leads 480 or 504, which is not electrically connected to ground by contacts 653 or 654, respectively, is applied as the output signals from the preamplifier.

In operation, a relay coil 651, when actuated by a foot switch 657, mechanically closes the normally open contact 653, which is operatively connected between lead 480 and ground 656. The output 504 from the second electrical signal processing channel is applied via a normally closed contact 654 to ground 656, which occurs when the relay coil 651 is not energized. Thus, depending on the position of the foot switch 657 and whether coil 651 is energized or deenergized, at least one of the first electrical signal processing channel and the second electrical signal processing channel is electrically grounded and the output signals thereof are thereby disconnected from the output terminal 470 in FIG. 8(A).

The electrical circuit diagrams of FIGS. 9 through 13, inclusive, which will be discussed hereinafter, are circuits which are capable of at least one of selectively amplifying, distorting or adding preselected harmonic content to the second controlled amplitude output signal. Any one of the circuits described hereinbelow with respect to FIGS. 9 through 13, inclusive, can be inserted into the input means 420 or into any one of the first through fourth of the selectively interconnectable signal processing means 440, 454, 490 and 496, respectively, all as illustrated in FIG. 8(a).

Figure 9:
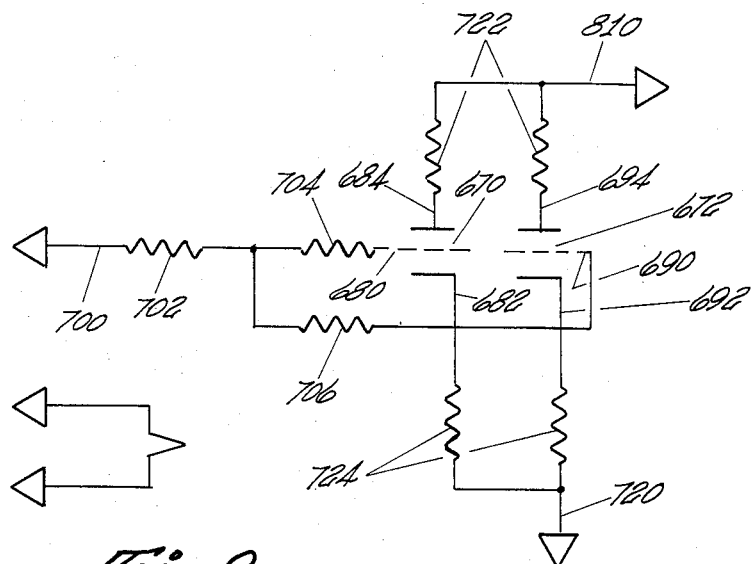
FIG. 9 is an electrical schematic diagram of the interconnectable signal processing means in the form of a pluggable module which is adapted for amplifying an audio signal.

The circuit illustrated in FIG. 9 can be characterized as a "normal" module schematic utilizing a dual-triode vacuum tube, such as a 12AX7, having a first triode 670 and a second triode 672. Triode 670 has a grid 680, a cathode 682, and an anode 684. The second triode stage 672 has a grid 690, a cathode 692, and an anode 694. In use, an input signal is applied across input 700 which applies the input signal through an input resistor 702 and grid resistors 704 and 706 to grids 680 and 690, respectively. The output signal from the first triode tube 670 appears at least 810, with lead 720 being electrically grounded. Plate resistors 722 and cathode resistors 724 function as a voltage-dividing network to establish operating characteristics of the tube. In this arrangement, it is desirable to use a dual-triode vaccum tube having high mu in order to obtain the amplification of the signal. The circuit illustrated in FIG. 9 provides an output signal which can be characterized as clean and quiet, with low distortion. The frequency range is in the order of 20 hertz to 20 kilohertz.

Figure 10:
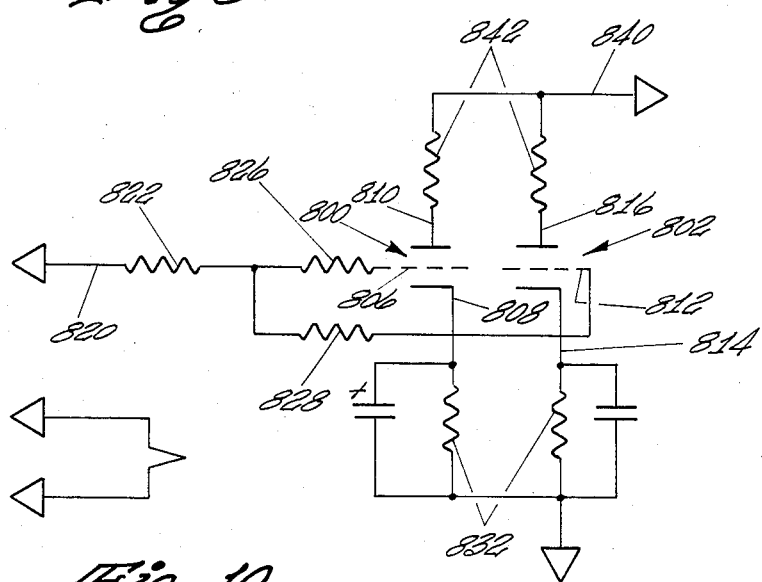
FIG. 10 is an electrical schematic diagram of an interconnectable signal processing means in the form of a pluggable module for producing distortion in the electrical signals.

FIG. 10 illustrates a "classical" module schematic diagram utilizing a dual-triode vacuum tube having a high mu. In the circuit of FIG. 10, the circuit utilizes a dual-triode vacuum tube having triode stages 800 and 802. Triode stage 800 has a grid 806, a cathode 808, and an anode 810. The second triode stage 802 has a grid 812, a cathode 814, and an anode 816. An input signal is applied to input 820 across a voltage-dropping resistor 822 and is applied via grid resistors 826 and 828 to the grids 806 and 812, respectively. In the embodiment of FIG. 10, the cathodes 808 and 814 are electrically connected through RC networks 832. The anodes 810 and 816 are electrically connected to an output 840 by means of anode resistors 842. The output from the "classical" module schematic of FIG. 10 can be characterized as having approximately six db more gain than the circuit illustrated in FIG. 9 and has a higher distortion level than the circuit of FIG. 9. The frequency range of the circuit of FIG. 10 is approximately 70 hertz to 17,000 hertz.

Figure 11:
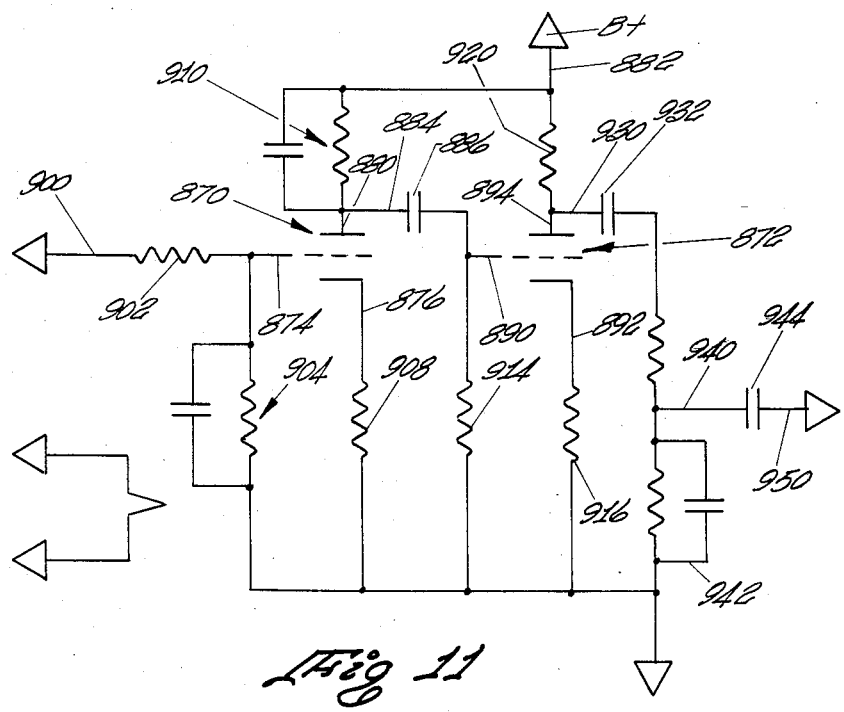
FIG. 11 is an electrical schematic diagram of an interconnectable signal processing means in the form of a pluggable module for producing high, overdrive signals in the electrical signal.

FIG. 11 illustrates a "high-gain" module schematic utilizing a high mu dual-triode vacuum tube, such as a 12AX7. In the embodiment of FIG. 11, the dual-triode vacuum tube has triode stages 870 and 872. Triode stage 870 has a grid 874, a cathode 876, and an anode 880. The other triode stage 872 includes a grid 890, a cathode 892, and an anode 894. The input signal to this stage is applied to input 900 which applies the signal across a dropping resistor 902 to the grid 874 of triode 870. Also, the signal after the dropping resistor 902 appears across blocking RC network 904. An RC network 910 is connected across the anode 880 to B+ power supply which appears on terminal 882. The output signal developed from the first triode stage appears on output 884 and is coupled by an AC coupling capacitor 886 to the grid 890 of the second triode stage 872. A grid resistor 914 establishes the operating voltage for the grid. The cathode 892 has its operating characteristics established by a cathode resistor 916. The anode 894 of the second triode 872 is electrically connected by a resistor 920 to the B+ power supply appearing on lead 882.

The output signals developed by the second triode 872 appear on output 930, which output signals are applied by a coupling capacitor 932 to output 940. An RC network 942, in cooperation with the AC coupling capacitor 944, establishes the band width of the electrical signal ultimately appearing on output lead 950. The circuit illustrated in FIG. 11 can be characterized as two cascaded stages which are similar to two independent amplifying stages illustrated in FIG. 9. In one embodiment, the circuit of FIG. 11 has 34 decibels more gain than that of FIG. 9, resulting in higher overdrive, and has a frequency output range of 150 hertz to 10,000 hertz.

Figure 12:
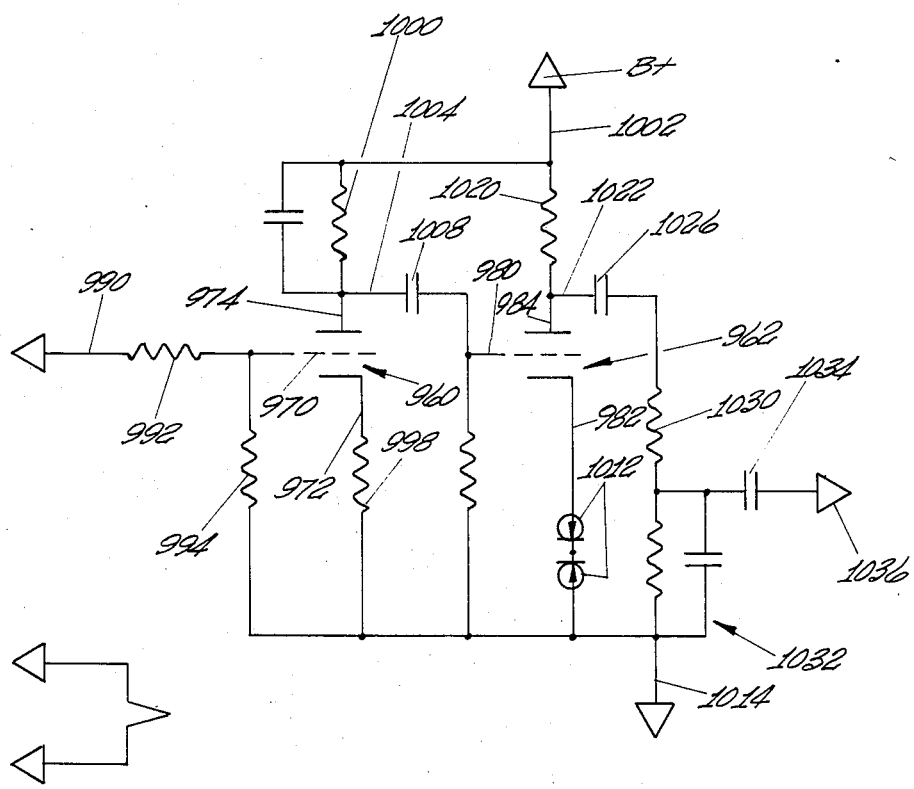
FIG. 12 is an electrical schematic diagram of an interconnectable signal processing means in the form of a pluggable module for providing a smooth overdrive and increased band width in the electrical signal.

The circuit illustrated in FIG. 12 likewise utilizes a dual-triode vacuum tube having a high mu, such as a 12AX7 vacuum tube. In the circuit illustrated in FIG. 12, the dual-triode vacuum tube has a first triode stage 960 and a second triode stage 962. The first triode stage 960 includes a grid 970, a cathode 972, and an anode 974. The second triode stage 962 includes a grid 980, a cathode 982 and an anode 984. An input signal is applied to this stage on lead 990, across a voltage-dividing network, comprising dropping resistors 992 and 994, to grid 970 of the first stage 960. The cathode 972 of the first stage 960 is electrically connected by a voltage-dropping resistor 998 to ground. The anode 974 is electrically connected by an RC dropping network 1000 across a B+ power supply on lead 1002. The output from the first triode 960 appears on output 1004 and is coupled via an AC-coupling capacitor 1008 to the grid 980 of the second triode 962. A dropping resistor 1010 is electrically connected between the grid 980 and ground 1014 to establish the operating characteristics of the triode 962. The cathode 982 of the second triode 962 is connected across a pair of back-to-back PN diodes, shown generally as 1012, such as PN diodes CL-1301. The diodes 1012 establish a cut-off level for the postive-going and negative-going excursions of the voltages developed between the cathode 982 and ground 1014. The anode 984 of the second triode 962 is connected via a voltage-dropping resistor 1020 to the B+ power supply appearing on lead 1002. The output of the second triode 962 appears across output 1022 which is applied via a coupling capacitor 1026 across a voltage-dropping resistor 1030, in parallel to an RC network 1032 and a via a second AC coupling capacitor 1034 to output lead 1036. The circuit illustrated in FIG. 12 can be characterized as producing a very clean output signal having low distortion and low noise with very hard overdrive.

Figure 13:
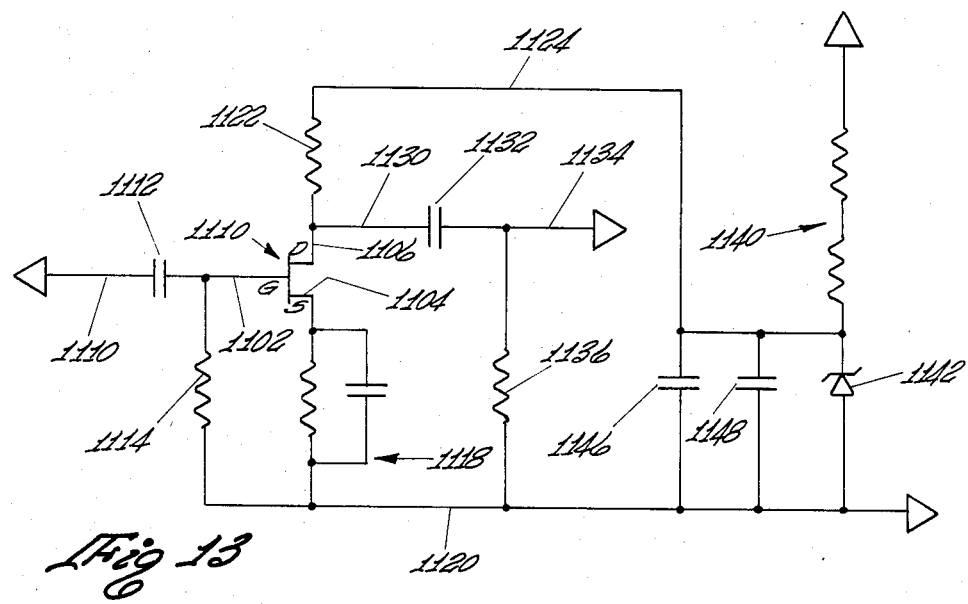
FIG. 13 is an electrical schematic diagram of an interconnectable signal processing means in the fom of a pluggable module for producing lower order harmonics and a hard overdrive in the electrical signal.

FIG. 13 illustrates a schematic diagram of a circuit utilizing a field effect transistor, such as a General Electric FET-1 or equivalent. The field effect transistor 1100 has a gate 1102, a source 1104, and a drain 1106. An input signal is applied to input 1110 and is coupled by a coupling capacitor 1112 to the gate 1102. A voltage-dropping resistor 1114 establishes the operating voltages required for the field effect transistor 1100. The source 1104 is electrically connected via an RC network, shown generally as 1118, to ground 1120, while the drain 1106 is electrically connected to a voltage-dropping resistor 1122 which, in turn, is connected to a B+ power supply which appears on lead 1124. The output of the drain 1106 appears on lead 1130 and is coupled by an AC-coupling capacitor 1132 and applied to output 1134, which output is electrically connected across a high-impedance resistor 1136 to ground 1120. The B+ lead 1124 is electrically connected to a clamping network which comprises resistors 1140 and a clamping zener diode 1142. Noise-suppression capacitors 1146 and 1148 are connected across the B+ power supply and ground to remove spurious noise signals from the B+ power supply lead 1124. The spurious noise signals are generated by the clamping effect of the zener diode 1142. In the preferred embodiment, the zener diode is No. 1N4748 which has a 22 volt rating and one watt capacity. The circuitry illustrated in FIG. 13 can be characterized as providing smooth, lower-order harmonics in a manner similar to a vacuum tube without any of the microphonics associated with the vacuum tube. The circuit overall has lower noise, has a slightly harder overdrive characteristic than a vacuum tube and exhibits a long life. One application for the circuit illustrated in FIG. 13 is in connection with keyboards and synthesizers.

Figure 14:
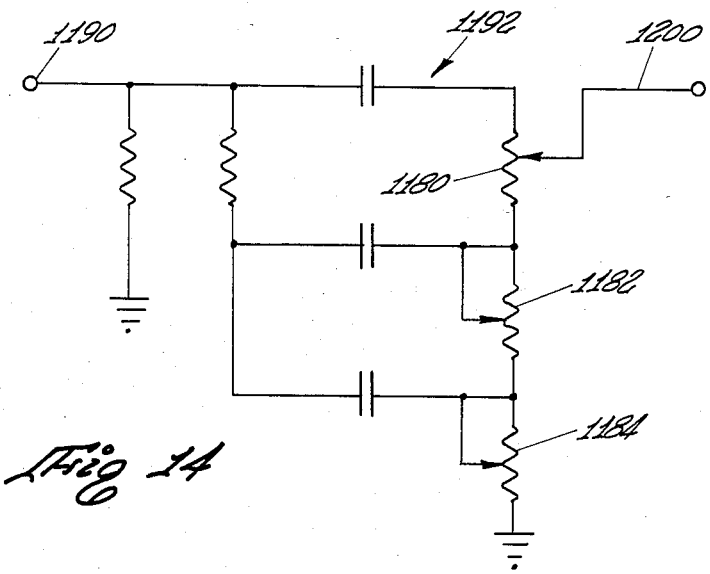
FIG. 14 is an electrical schematic diagram of a tone control circuit for providing treble, bass and midrange adjustments.

FIG. 14 illustrates a typical tone control circuit which can be utilized for the tone controls referenced as tone controls 240 and 242 in FIG. 6. The tone control circuit includes three variable potentiometers, such as potentiometer 1180 for treble frequencies, potentiometer 1182 for bass frequencies, and potentiometer 1184 for midrange frequencies. The input to the tone control circuits are applied to input 1190. The signal received at 1190 is applied via the resistor at RC network, shown generally as 1192, to each of the potentiometers. The output from the tone control circuit appears on output 1200. As set forth in connection with the description of the first electrical signal processing channel and the second electrical signal processing channel described in connection with FIGS. 5 and 6, each of the first and second electrical signal processing circuits includes its own separate tone control circuit.

FIG. 15 discloses waveforms to show the operating effect of circuits on a sine wave signal. The waveforms specifically illustrate the effects of the circuits of FIGS. 9 through 13 on the sine wave signal. The waveforms in FIGS. 15(a) through 15(g) are illustrated on the basis that all modules are in an overdrive stage. The input signal utilized and illustrated in waveform 15(a) can be characterized as a low-distortion sine wave having a frequency rate of one kilohertz with a 10 millivolt peak, RMS.

Figure 15A:
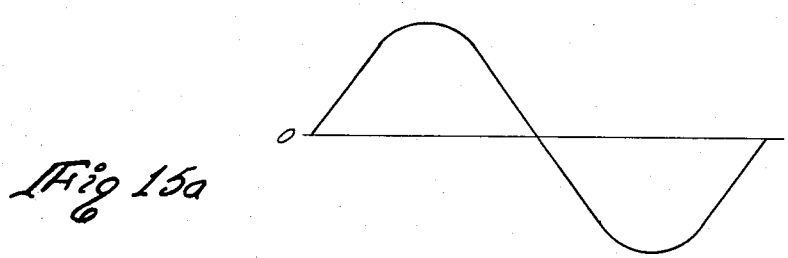
FIGS. 15(a), 15(b), 15(c), 15(d), 15(e), 15(f) and 15(g) are waveforms illustrating an input sound wave and the effects introduced into the signals by the signal processing modules and wherein the circuitry illustrated for the pluggable modules in FIGS. 9, 10, 11, 12 and 13 are capable of producing waveforms illustrated as FIGS. 15(b), 15(c), 15(d), 15(e) and 15(f), respectively.
Figure 15B:
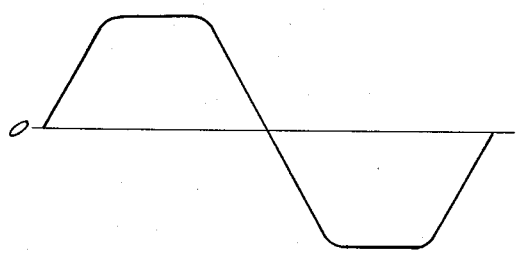

The waveform illustrated in FIG. 15(b) is generated by a circuit similar to that of FIG. 9 and exhibits an overdrive at approximately one volt with a 20 db gain. Note that the waveform illustrated in FIG. 15(b) is relatively smooth and that the positive-going excursion very closely follows that of the input sine wave illustrated in waveform 15(a).

Figure 15C:
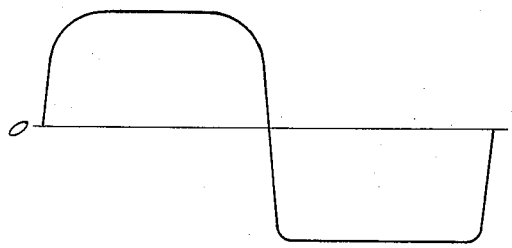

The waveform of FIG. 15(c) represents the response of the circuit in FIG. 10. As illustrated in FIG. 15(c), the waveform becomes slightly rounded in shape and more like a square wave. The circuit goes into overdrive at approximately one volt and provides a gain of approximately 26 db.

Figure 15D:
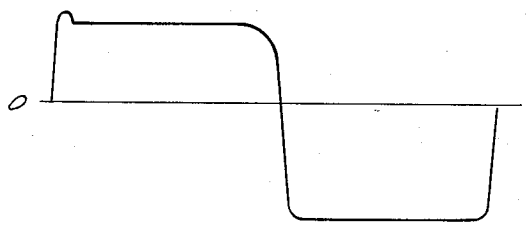

The waveform of FIG. 15(d) illustrates the effect that the circuit of FIG. 11 would have on the input of 15(a). The signal becomes generally square-shaped with the positive-going excursion having a slight impulse on the leading edge of the waveform, thereby exhibiting some distortion. The circuit goes into overdrive at approximately one volt and exhibits a 50 db gain.

Figure 15E:
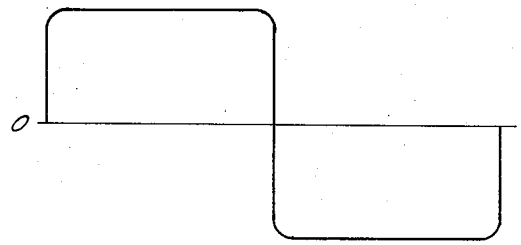

The waveform of FIG. 15(e) illustrates the signal produced by the circuit of FIG. 12, which is characterized as a high-gain, low-noise circuit. The waveform is relatively rectangular in shape, and the circuit is designed to overdrive at approximately one volt with a gain of 50 db.

Figure 15F:
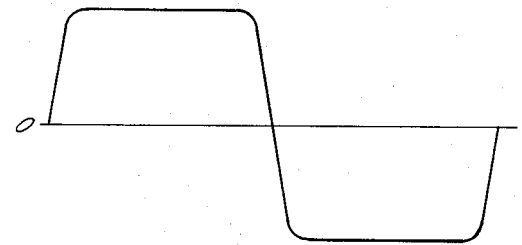

The waveform of FIG. 15(f) illustrates the signal produced by the circuit of FIG. 13 in response to the input sine wave of 15(a). The signal is somewhat trapezoidal in shape, is clean with low distortion, and the circuit goes into overdrive at approximately one volt. The gain is in the order of 20 db.

Figure 15G:
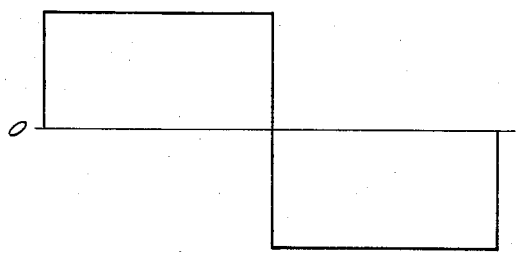

The waveform of FIG. 15(g) illustrates a waveform which can be generated by an appropriate selectively interconnectable signal processing circuit utilizing an integrated circuit wherein the integrated circuit is designed to specifically generate a square wave. In one embodiment, the IC circuit is driven into overdrive at approximately one volt and has a gain of 20 db.

By utilizing the teaching of the present invention when playing a musical instrument, the preamplifier allows a user to change tone or sound quickly and easily by actuation of a switching means. This enables the user to develop a number of different playing styles for different entertainment groups or to permit the user to change one tone or style to a second tone or style without the purchase of additional amplification equipment. The use of such amplifier has utility in concerts, recording studios, and the like, and has the benefit of providing a substantial amount of control to the user to quickly and easily change the tone and sound of the music developed by the musical instrument.

Because of the modular structure of each stage, each pluggable module or the selectively interconnectable signal processing stages are independent from each other. As illustrated in connection with FIGS. 9 through 13, a vacuum tube, such as a dual-triode vacuum tube, can be used for two different purposes, thereby resulting in efficient use of a vacuum tube in a circuit which is small and compact and which can be assembled in the manner as illustrated in the pluggable module of FIG. 7.

One of the audio frequency signals processed by each of the first and second signal processing channels is then applied as a preprocessed audio frequency signal to the variable power amplifier which can amplify the same or add additional harmonics to the output signal.

The preamplifier of the present invention enables the circuitry to be easily serviced. The circuit is highly dependable due to its isolation characteristics on a stage-to-stage basis and permits a user to customize the user's tone and sound so that the tones and sounds of a user can be specifically adjusted to represent the characteristic sound desired by such a user of the musical instrument. Thus, the signal processing occurs in the preamplifier stage and the variable power amplifier performs the function of amplifying only.

In the preferred embodiment, the musical instrument is a guitar having an electromagnetic pickup mounted thereon. Electromagnetic pickups are well known in the art and can produce a wide variety of output signals and sounds on their own behalf. Thus, by matching the characteristics of the electromagnetic pickup with the characteristics of the preamplifier, a wide range of unique and novel sounds can be generated by the preamplifier before applying the same to the variable power amplifier. However, the input to the preamplifier can be utilized from a wide range of musical instruments, such as keyboards, synthesizers, multistringed instruments, and the like.

One feature of the pluggable module approach utilized in the preamplifier of the present invention is that a wide number of specific, unique circuits can be designed to develop a wide range of noises, sounds, harmonics, or the like. The use of vacuum tubes alone or vacuum tubes in combination with solid-state devices such as field effect transistors, clamping diodes, and the like or the use of straight solid-state devices such as field effect transistors in lieu of vacuum tubes is envisioned to be within the teachings of the present invention. As a user becomes more familiar with the wide range of amplification, distortion, and the amount of harmonics which can be added, it is anticipated that the user can utilize a wide number of specifically designed circuits to produce specific sounds, all of which can be plugged into the standard preamplifier circuit to produce the desired sound.

It is envisioned that the output of the preamplifier can be used to establish the harmonics, distortion and other tone or sound qualities which are then applied to the variable power amplifier, which merely performs the function of amplifying the input signal. This avoids the requirement or use of amplifiers being driven into an overdriven condition or state in order to generate the nonlinear distortion sound which is desired in certain applications.

The preamplifier of the present invention permits the signal, tone, quality, distortion, and the like, to be selectively developed as described herein, and the output signal can then be applied as an input to the variable power amplifier. The variable power amplifier can be played for listening or practice at a relatively low level since it is unnecessary to drive the amplifier into saturation or overdrive to obtain the distortion or nonlinear sounds sometimes desired in connection with certain types of music.

The schematic diagram of the basic circuits and the circuit diagram of the interconnectable signal processing stages and variable power amplifier are merely exemplary. It is envisioned that additional circuits can be designed using other vacuum tubes alone, vacuum tubes in combination with solid-state devices, or solid-state devices alone to obtain a wide range of electrical signals which are selectively amplified or have distortion or harmonic control added thereto.

What is claimed is:

1. A variable power amplifier comprising
a constant current differential amplifying means adapted to receive preprocessed audio frequency electrical signals and for producing discrete electrical current signals having an out-of-phase relationship therebetween which is representative of said audio frequency electrical signals;
a variable power amplifying means including a cascaded driving amplifying means for receiving and amplifying the out-of-phase electrical current signals and a variable impedance means electrically connected to said cascaded driving amplifying means, said cascaded driving amplifying means producing in response to electrical current signals selectively amplified output signals wherein the output driving power of said variable power amplifying means is determined by the cascaded driving amplifying means and the out-of-phase electrical current signals;
a push-pull amplifying means including an output transformer operatively coupled to said variable power amplifying means and to an amplifier output terminal to amplify and apply to said amplifier output terminal said selectively amplified output signals; and
a variable damping means including a sensing means for sensing the loading on said output transformer and means defining a feedback loop for producing a feedback signal having a magnitude determined by said sensing means, said variable damping means including means for applying the feedback signal as an input to the constant current differential amplifying means to control the current level of said electrical current signals as a function of the loading sensed by said sensing means on said output transformer.

2. The amplifier of claim 1 wherein said constant current differential amplifying means comprises
a pair of triode vacuum tubes electrically connected in a common cathode configuration wherein the anode/cathode current level is controlled by a current source in response to the magnitude and polarity of the feedback signal applied to the current differential amplifying means by said means defining said feedback loop.

3. The amplifier of claim 2 wherein said means defining a feedback loop includes means for developing a separate negative feedback signal which is applied to the grid of a selected one of the triode vacuum tubes of the constant current differential amplifying means.

4. The amplifier of claim 1 wherein said variable power amplifying means includes a pair of triode vacuum tubes with selected plate resistors operatively coupled to each plate and having a constant voltage applied to their respective grids enabling the anode/cathode current thereof to be controlled by the magnitude of current passing through each triode vacuum tube plate resistor.

5. The amplifier of claim 1 wherein said push-pull amplifying means comprises at least one pair of pentodes electrically connected in parallel and wherein said pair of pentodes is electrically connected in a push-pull circuit relationship.

6. The amplifier of claim 5 wherein said output transformer is an audio output wound transformer and wherein said push-pull amplifying means further includes
   a harmonic signal generating means electrically connected between said audio output transformer and said two pairs of pentodes; and
   switching means operatively coupled to said harmonic signal generating means for selectively switching the same into circuit operative relationship with the pentodes and audio output transformer to impose selected harmonic signals onto the selectively amplified output signals applied to the amplifier output terminal.

7. The amplifier of claim 6 wherein said harmonic signal generating means is a triode vacuum tube capable of imposing low-order harmonic signals onto the selectively amplified output signals applied to said amplifier output terminal.

8. The amplifier of claim 6 wherein said harmonic signal generating means is a pentode vacuum tube capable of imposing higher-order harmonic signals onto the selectively amplified output signals applied to said amplifier output terminal.

9. A signal processing, variable power amplifier for audio frequency electrical signals generated by a musical instrument comprising
   a preamplifier adapted to receive audio frequency electrical signals comprising
      input means adapted to selectively process the audio frequency electrical signals;
      at least one electrical signal processing channel being operatively connected to said input processing means for receiving said selectively processed audio frequency electrical signals and for producing in response thereto at least one output signal, said at least one electrical signal processing channel including a plurality of selectively interconnectable signal processing means at least one of which is capable of at least one of selectively amplifying, distorting and adding a preselected harmonic content to said one output signal;
      means including a preamplifier output operatively coupled to said at least one electrical signal processing channel for applying said at least one output signal as a preprocessed audio frequency electrical signal to said preamplifier output;
   a variable power amplifier operatively coupled to said preamplifier output comprising
      a constant current differential amplifying means adapted to receive said preprocessed audio frequency electrical signals and for producing discrete electrical output signals having an out-of-phase relationship therebetween which is representative of said preprocessed audio frequency electrical signals;
      a variable power amplifying means including a cascaded driving amplifying means for receiving and amplifying the out-of-phase electrical current signals and a variable impedance means electrically connected to said cascaded driving amplifying means, said cascaded driving amplifying means producing in response to said electrical current signals selectively amplified electrical output signals wherein the output driving power of said variable power amplifying means is determined by the cascaded driving amplifying means and the out-of-phase electrical current signals;
      a push-pull amplifying means including an output transformer operatively coupled to said variable power amplifying means and to an amplifier output terminal to amplify and apply to said amplifier output terminal said selectively amplified output signals; and
   a variable damping means including a sensing means for sensing the loading on said output transformer and means defining a feedback loop for producing a feedback signal having a magnitude determined by said sensing means, said variable damping means including means for applying the feedback signal as an input to the constant current differential amplifying means to control the current level of said electrical current signals as a function of the loading sensed by said sensing means on said output transformer to vary the output driving power of the variable power amplifier which applies the selectively amplified output signals applied to said amplifier output terminal.

10. The amplifier of claim 9 wherein said output transformer is an audio output transformer and wherein said push-pull amplifying means further includes
    at least one pair of pentodes electrically connected in parallel and wherein said at least one pair of pentodes is electrically connected in a push pull circuit relationship;
    a vacuum tube electrically connected between said audio output transformer and said at least one pair of pentodes; and
    switching means operatively coupled to said vacuum tube to selectively switch said vacuum tube into circuit operative relationship with the pentodes and audio output transformer to impose selected harmonic signals onto the selectively amplified output signals applied to the amplifier output terminal.

11. The amplifier of claim 10 wherein said vacuum tube is a triode vacuum tube capable of imposing low-order harmonic signals onto the selectively amplified output signals applied to said amplifier output terminal.

12. The amplifier of claim 10 wherein said vacuum tube is a pentode vacuum tube capable of imposing higher-order harmonic signals onto the selectively amplified output signals applied to said amplifier output terminal.

13. The amplifier of claim 9 wherein said constant current differential amplifying means includes
    a pair of triode vacuum tubes electrically connected in a common cathode configuration wherein the anode/cathode current level is controlled by a current source in response to the magnitude and polarity of the feedback signal applied to the current differential amplifying means by said means defining said feedback loop; and wherein said means defining a feed back loop includes means for developing a separate negative feedback signal which is applied to the grid of a selected one of the triode vacuum tubes of the constant current differential amplifying means.

14. A signal processing, variable power amplifier adapted to receive audio frequency electrical signals generated by a musical instrument for providing controlled output signals therefrom having selected distortion and harmonic content, said amplifier comprising a preamplifier comprising means adapted to selectively amplify audio frequency electrical signals generated by said musical instrument;

a first electrical signal processing channel operatively connected to said amplifying means for receiving said selectively amplified audio frequency electrical signals and for producing in response thereto a first controlled output signal, said first electrical signal processing channel including a plurality of selectively interconnectable signal processing means at least one of which is capable of at least one of selectively amplifying, distorting and adding a preselected harmonic content to said first controlled output signal;

a second electrical signal processing channel operatively connected to said amplifying means for receiving said selectively amplified audio frequency electrical signals and for producing in response thereto a second controlled output signal, said second electrical signal processing channel including a plurality of selectively interconnectable signal processing means at least one of which is capable of at least one of selectively amplifying, distorting and adding a preselected harmonic content to said second controlled output signal;

means including a preamplifier output terminal operatively coupled to said first and second electrical signal processing channels for selectively applying one of said first and second controlled outout signals as a preprocessed audio frequency electrical signal to said preamplifier output;

a variable power amplifier operatively coupled to said preamplifier output comprising a constant current differential amplifying means adapted to receive said preprocessed audio frequency electrical signals and for producing discrete electrical current signals having an out-of-phase relationship therebetween which is representative of said audio frequency electrical signals;

a variable power amplifying means including a cascaded driving amplifying means for receiving and amplifying the out-of-phase electrical current signals and a variable impedance means electrically connected to said cascaded driving amplifying means, said cascaded driving amplifying means producing in response to said electrical current signals selectively amplified output signals wherein the output driving power of said variable power amplifying means is determined by the cascaded driving amplifying means and the out-of-phase electrical current signals;

a push-pull amplifying means including an output transformer operatively coupled to said variable power amplifying means and to an amplifier output terminal to amplify and apply to said amplifier output terminal said selectively amplified output signals; and a variable damping means including a sensing means for sensing the loading on said output transformer and means defining a feedback loop for producing a feedback signal having a magnitude and polarity determined by said sensing means, said variable damping means including means for applying the feedback signal as an input to the constant current differential amplifying means to control the current level of said electrical current signals as a function of the loading sensed by said sensing means on said output transformer to vary the output driving power of the variable power amplifier which applies the selectively amplified output signals applied to said amplifier output terminal.

15. The amplifier of claim 14 wherein said output transformer is an audio output wound transformer and wherein said push-pull amplifying means further includes a vacuum tube electrically connected between said audio output transformer and said at least one pair of pentodes; and switching means operatively coupled to said vacuum tube to selectively switch said vacuum tube into circuit operative relationship with the at least one pair of pentodes and said audio output transformer to impose selected harmonic signals onto the selectively amplified output signals applied to the amplifier output terminal.

16. The amplifier of claim 15 wherein said vacuum tube is a triode vacuum tube capable of imposing low-order harmonic signals onto the selectively amplified output signals applied to said amplifier output terminal.

17. The amplifier of claim 15 wherein said vacuum tube is a pentode vacuum tube capable of imposing higher-order harmonic signals onto the selectively amplified output signals applied to said amplifier output terminal.

18. The amplifier of claim 15 wherein said means for defining a feedback loop include means for developing a separate negative feedback signal which is applied to the constant current differential amplifying means.

19. The amplifier of claim 14 wherein said preamplifier includes foot control means operatively coupled to said means for selectively applying one of said first and second controlled output signals to said preamplifier output terminal for selecting which controlled output signals of said first signal processing channel and said second signal processing channel are to be selectively applied as preprocessed audio frequency electrical signals to said preamplifier output terminal.

20. A signal processing variable power amplifier for audio frequency signals generated by a musical instrument comprising a housing including means defining a top surface having an elongated opening formed therein and a hollowed-out central area which communicates with said elongated opening, said housing including means defining a control panel having a plurality of openings therethrough which communicates with said hollowed-out area;

a printed circuit board located in said hollowed-out central cavity and positioned below and accessible through said elongated opening, said printed circuit board including
a preamplifier comprising
an input stage;
a first electrical signal processing channel;
a second electrical signal processing channel;
an output terminal operatively coupled to said first and second electrical signal processing channels;
- a first electrical connector mounted on said printed circuit board and electrically connected to said input stage;
- a second electrical connector mounted on said printed circuit board and electrically connected to said input stage;
- a third electrical connector mounted on said printed circuit board and electrically connected to said input stage;
- a switch electrically connected between said output terminal and each of said first signal processing channel and said second electrical signal processing channel, said switch being operative for selectively applying electrical signals from one of said first and second electrical signal processing channels as a preprocessed audio frequency electrical signal to said output terminal;
a variable power amplifier including
- a constant current differential amplifier operatively coupled to said output terminal for producing discrete electrical current signals;
- a variable power amplifying means including a cascaded driving amplifier operatively connected to a variable impedance means, said cascaded driving amplifier being responsive to said electrical current signals to produce selectively amplified output signals, the output driving power of which is determined by the cascaded driving amplifier and the out of phase electrical current signals;
- a push-pull amplifying means including an output transformer operatively coupled to said variable power amplifying means and to an amplifier output terminal to amplify and apply to said amplifier output terminal said selectively amplified output signals; and
a variable damping means including a sensing means for sensing the loading on said output transformer
an electrical circuit defining a feedback loop which is electrically connected to said variable damping means for producing a feedback signal having a magnitude and polarity which are determined by the sensing means; and
external circuit adjustment controls extending from said printed circuit board through the plurality of said openings in the control panel of said housing.

21. The amplifier of claim 20 further comprising
a first pluggable module including an elongated electrical connecting member capable of being inserted into any one of said electrical connectors, said first pluggable module being capable of being passed through said elongated opening and positioned with said electrical connecting member in mechanical engagement with any one of said electrical connectors and electrically connecting said first pluggable module with said printed circuit board, said first pluggable module including an electric circuit which is capable of at least one of selectively amplifying, distorting, and adding preselected harmonic content to electrical signals.

22. The amplifier of claim 21 wherein said first pluggable module is capable of amplifying and is positioned in said first electrical connector for amplifying signals processed by said input stage and further comprising
a second and third pluggable module, each of which includes an elongated electrical connecting member capable of being inserted into any one of said second and third electrical connectors, each of said second and third pluggable modules being capable of being passed through said elongated opening and positioned with its associated elongated electrical connecting member in mechanical engagement with said second electrical connector and said third electrical connector, each of said second and third pluggable modules including an electrical circuit which is capable of at least one of selectively amplifying, distorting, and adding preselected harmonic content to the signals processed by such first and second electrical signal processing channels.

23. A method for processing audio frequency electrical signals generated by a musical instrument comprising the steps of
receiving preprocessed audio frequency electrical signals with a receiving means including a constant current differential amplifying means for producing discrete electrical current signals having an out-of-phase relationship therebetween which is representative of said preprocessed audio frequency electrical signals;
producing with a variable power amplifying means including a cascaded driving amplifying means for receiving and amplifying the out-of-phase electrical current signals and a variable impedance means which is electrically connected to said cascaded driving amplifying means and wherein said cascaded driving amplifying means produces in response to said electrical current signals selectively amplified output signals wherein the output driving power of the variable power amplifying means is determined by the cascaded driving amplifying means and the out-of-phase electrical signals;
amplifying said selectively amplified output signals with a pushpull amplifying means including an output transformer operatively coupled thereto and applying the amplified output signals to an amplifier output terminal;
sensing the loading on said output transformer with a variable damping means including a sensing element and producing a feedback signal therefrom having a magnitude and polarity which are determined by said sensing means in response to the loading on said output transformer; and
applying the feedback signal as an input to the constant current differential amplifying means to control the current level of said electrical signals as a function of the loading sensed by said sensing means on said output transformer wherein the current level of the electrical current signals is applied to the constant current differential amplifying means which varies the output driving power of the variable power amplifier which applies the selectively amplified signals applied to said amplifier output terminal.

24. The method of claim 23 further comprising the step of processing the audio frequency electrical signals with a preamplifier which includes signal processing means at least one of which is capable of at least one of selectively amplifying, distorting and adding preselected harmonic content to said audio frequency electrical signals to form said preprocessed audio frequency electrical signals.

25. The method of claim 24 further comprising the steps of
selectively processing said audio frequency electrical signals with at least a pair of electrical signal processing channels, each of which includes a plurality of selectively interconnectable signal processing means at least one of which is capable of at least one of selectively amplifying, distorting and adding preselected harmonic content to said preprocessed audio frequency electrical signals; and
selectively inserting into each of said pair of signal processing channels at least one interconnectable signal processing means which has at least one of a preselected amplification, distortion and harmonic content characteristic to selectively perform the steps of at least one of selectively amplifying, distorting and adding preselected harmonic content to the audio frequency electrical signals processed by each of the electrical signal processing channels.

* * * * *